(12) United States Patent
Yu et al.

(10) Patent No.: US 8,019,943 B2
(45) Date of Patent: Sep. 13, 2011

(54) HIGH ENDURANCE NON-VOLATILE MEMORY DEVICES

(75) Inventors: I-Kang Yu, Palo Alto, CA (US); David Q. Chow, San Jose, CA (US); Charles C. Lee, Cupertino, CA (US); Abraham Chih-Kang Ma, Fremont, CA (US); Ming-Shiang Shen, Taipei Hsien (TW)

(73) Assignee: Super Talent Electronics, Inc., San Jose, CA (US)

( * ) Notice: Subject to any disclaimer, the term of this patent is extended or adjusted under 35 U.S.C. 154(b) by 0 days.

(21) Appl. No.: 13/089,898

(22) Filed: Apr. 19, 2011

(65) Prior Publication Data

US 2011/0197017 A1     Aug. 11, 2011

Related U.S. Application Data

(60) Continuation of application No. 12/035,398, filed on Feb. 21, 2008, now Pat. No. 7,953,931, which is a continuation-in-part of application No. 11/624,667, filed on Jan. 18, 2007, now abandoned, which is a division of application No. 09/478,720, filed on Jan. 6, 2000, now Pat. No. 7,257,714.

(51) Int. Cl.
  *G06F 12/00* (2006.01)
(52) U.S. Cl. .................................... 711/117
(58) Field of Classification Search .............. 711/117
  See application file for complete search history.

(56) References Cited

U.S. PATENT DOCUMENTS

| | | | |
|---|---|---|---|
| 5,388,242 A | 2/1995 | Jewett | |
| 5,396,614 A | 3/1995 | Khalidi et al. | |
| 5,548,788 A | 8/1996 | McGillis et al. | |
| 5,668,968 A * | 9/1997 | Wu | 711/3 |
| 5,696,929 A | 12/1997 | Hasbun et al. | |
| 5,724,538 A | 3/1998 | Morris et al. | |
| 5,742,934 A | 4/1998 | Shinohara | |

(Continued)

FOREIGN PATENT DOCUMENTS

EP      529217 A1 *   3/1993

OTHER PUBLICATIONS

USPTO U.S. Appl. No. 12/035,398 (Parent Case) Non-Final Office Action Mailed on Dec. 17, 2010.

(Continued)

*Primary Examiner* — Hetul Patel
*Assistant Examiner* — Christopher Birkhimer
(74) *Attorney, Agent, or Firm* — Roger H. Chu

(57) ABSTRACT

High endurance non-volatile memory devices (NVMD) are described. A high endurance NVMD includes an I/O interface, a NVM controller, a CPU along with a volatile memory subsystem and at least one non-volatile memory (NVM) module. The volatile memory cache subsystem is configured as a data cache subsystem. The at least one NVM module is configured as a data storage when the NVMD is adapted to a host computer system. The I/O interface is configured to receive incoming data from the host to the data cache subsystem and to send request data from the data cache subsystem to the host. The at least one NVM module may comprise at least first and second types of NVM. The first type comprises SLC flash memory while the second type MLC flash. The first type of NVM is configured as a buffer between the data cache subsystem and the second type of NVM.

18 Claims, 37 Drawing Sheets

U.S. PATENT DOCUMENTS

| | | | |
|---|---|---|---|
| 5,765,201 A | 6/1998 | Manges et al. | |
| 5,774,133 A * | 6/1998 | Neave et al. | 345/505 |
| 6,914,846 B2 | 7/2005 | Harari et al. | |
| 7,139,864 B2 | 11/2006 | Bennett et al. | |
| 7,266,017 B2 | 9/2007 | Harari et al. | |
| 7,269,708 B2 | 9/2007 | Ware | |
| 7,283,397 B2 | 10/2007 | Harari et al. | |
| 7,292,476 B2 | 11/2007 | Goda et al. | |
| 7,301,809 B2 | 11/2007 | Sakui et al. | |
| 7,333,369 B2 | 2/2008 | Sakui et al. | |
| 2003/0161245 A1 | 8/2003 | Henrichs | |
| 2007/0253242 A1 | 11/2007 | Parkinson et al. | |

OTHER PUBLICATIONS

Jim Handy, (The Cache Memory Book: The Authoritative Reference on Cache Design), Second Edition, Academic Press, 1998, pp. 2-3, 26-29, 34-35, 50-57, 126-127, 130-131, 156-157, 210-211, 220-225.

J. David Irwin, (The Industrial Electronics Handbook), CRC Press, IEEE Press, 1997, pp. 65-66.

Dan Hystedt, (Intel Slashes PC Power-Up Time), Oct. 17, 2005, pp. 1-3, http://www.pcworld.com/article/123053/intel_slashes_pc_powerup_time.html.

* cited by examiner

| Data 451 | | | Spare 452 | | |
|---|---|---|---|---|---|
| Sector0 453a | Sector1 453b | ⋮ | LBA 454 | Set# 455 | NOH 456 | ECC and other info 458 |
| | | | | | | |
| | | | | | | |
| | | | | | | |
| | | | | | | |
| | | | | | | |

450

| Data 461 | | | Spare 462 | |
|---|---|---|---|---|
| Sector0 463 | Sector1 463b | ⋮ | LBA 464 | ECC and other info 468 |
| | | | | |
| | | | | |
| | | | | |
| | | | | |

460

FIG. 4C (c1) Read-Miss in SLC (c2) Read-Miss in MLC Cont.

HIGH ENDURANCE NON-VOLATILE MEMORY DEVICES

CROSS-REFERENCE TO RELATED APPLICATIONS

This application is a continuation of co-pending U.S. patent application Ser. No. 12/035,398 for the same title filed on Feb. 21, 2008 now U.S. Pat. No. 7,953,931, which is a continuation-in-part of co-pending U.S. patent application Ser. No. 11/624,667 filed on Jan. 18, 2007 now abandoned, entitled "Electronic data Storage Medium with Fingerprint Verification Capability", which is a divisional patent application of U.S. patent application Ser. No. 09/478,720 filed on Jan. 6, 2000, now U.S. Pat. No. 7,257,714 issued on Aug. 14, 2007, all of which are incorporated herein as though set forth in full.

FIELD OF THE INVENTION

The present invention relates to non-volatile memory devices, and more particularly to methods and systems for providing high endurance in non-volatile memory devices (NVMDs).

BACKGROUND OF THE INVENTION

Personal computers have become mainstream computing devices for the past two decades. One of the core components of a personal computer whether desktop or laptop is a mother board, which is the central or primary circuit board providing attachment points for one or more of the following: processor (CPU), graphics card, sound card, hard disk drive controller, memory (Random Access Memory (RAM), Read-Only Memory (ROM)), and other external devices. Traditionally, hard disk drives have been used as a data storage in a computing device. With advance of non-volatile memory (e.g., flash memory), some attempts have been made to use non-volatile memory as the storage. One form of flash memory is referred to as Single-Level Cell (SLC) flash memory, in which each flash memory cell stores two states or one bit of information. Another form is referred to as Multi-Level Cell (MLC) flash, which can store more than two states of information, for example, four states or two bits. Because the MLC flash can hold more information than the SLC flash in a same size chip or integrated circuit, it is therefore more economic to use the MLC flash to create a storage device for replacing the traditional hard disk drive.

However, there are problems associated with using flash memory. One of the main problems is that the life span of the flash memory is measured by number of times that the flash memory has been written (i.e., programmed) and erased. This problem has a relatively large impact to the MLC flash, because a typical life span is an order of magnitude lower than that of the SLC flash. The prior art solution is to use wear leveling technique to prolong the life span. But such solution is not sufficient for using MLC as data storage.

Therefore it would be desirable to provide a non-volatile memory device (NVMD) to improve the endurance of MLC flash memory.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

High endurance non-volatile memory devices (NVMD) are disclosed. According to one aspect of the present invention, a high endurance NVMD includes an input/output (I/O) interface, a NVM controller, a CPU along with a volatile memory cache subsystem and at least one non-volatile memory (NVM) module. The volatile memory cache subsystem is configured as a data cache for the at least one non-volatile memory module, which is configured as a data storage when the NVMD is adapted to a host computer system. The I/O interface is configured to receive incoming data from the host to the data cache subsystem and to send request data from the data cache subsystem to the host.

According to another aspect, the data cache may be comprised of dynamic random access memory (DRAM) configured with multi-level (e.g., L1, L2 and L3). The at least one non-volatile memory comprise single-level-cell (SLC), multi-bit-cell (MBC), or multi-level-cell (MLC) flash memory chips. SLC flash memory chip contains 2-bit of data per cell, while MBC or MLC contains more than 2-bit (e.g., 4, 8 or higher power of two). Other types of non-volatile memory may also be used, for example, phase-change memory, Magnetoresistive random access memory, Ferro-electric random access memory, Nano random access memory.

According to yet another aspect, the at least one NVM module may comprise first and second types of NVM. The first type comprises SLC flash memory while the second type MLC flash memory. The volatile memory and the at least non-volatile memory are arranged in a hierarchical scheme with the first type of NVM configured as a buffer between the data cache and the second type of NVM.

According to yet another aspect, data cached in the data cache subsystem is guaranteed to have a copy stored in the first type of NVM. The stored data in the first type of NVM is moved to the second type of NVM only if a predefined capacity of the first type has been used up. A usage tracking flag is included in each block of the first type of NVM to determine which block is the least used. The predefined capacity of the first type of NVM is so chosen that at least one data block is available for data programming.

According to yet another aspect, a plurality of NVMDs may be coupled to a central processing unit, which balances the data transfer operations to each of the NVMDs to evenly distribute the loads.

According to an exemplary embodiment of the present invention, a non-volatile memory device (NVMD) includes at least the following: a central processing unit (CPU); at least one non-volatile memory (NVM) module configured as a data storage of a host computer system, when the NVMD is adapted to the host; a NVM controller, coupling to the CPU, configured to manage the at least one NVM module; a volatile memory subsystem, coupling to the CPU and the NVM controller, configured as a data cache subsystem between the NVM module and the host; and an input/output (I/O) interface, coupling to the NVM controller, configured for receiving incoming data from the host to the data cache subsystem and configured for sending outgoing data from the data cache subsystem to the host, wherein said at least one non-volatile memory module comprises first and second types of NVM arranged in a hierarchical scheme with the first type of NVM configured as a buffer between the data cache subsystem and the second type of NVM and wherein total capacity of the data storage is a combined capacity of the first and second types of NVM.

According to another embodiment of the present invention, a method of managing data transfer operations in a high endurance non-volatile memory device (NVMD) adapted to a host computer system, the NVMD comprises a volatile memory as a data cache subsystem and at least one non-volatile memory module as a data storage of the host, the method comprises at least the following: receiving a data transfer request including a logical sector address (LSA) of data to be transferred from the host computer system; determining whether a 'cache-hit' or a 'cache-miss' status in the data cache subsystem according to the index and the tag derived from the received LSA, the 'cache-hit' status represents a 'cache-hit' cache line contains relevant data; determining whether the data transfer request is a read or a write operation; when the read operation and the 'cache-hit' are determined, retrieving requested data from the 'cache-hit' cache line and sending to the host; and updating a cache usage status; when the read operation and the 'cache-miss' are determined, loading the request data from the at least one non-volatile memory device based on the received LSA to a least-recently used (LRU) cache line in the data cache subsystem; sending the requested data to the host; and updating a cache usage status; when the write operation and the 'cache-hit' are determined, writing incoming data to 'cache-hit' cache line; updating the cache usage status; and storing the incoming data into the at least one non-volatile memory according to the received LSA; and when the write operation and the 'cache-miss' are determined, writing the incoming data to the LRU cache line; updating the cache usage status; and storing the incoming data into the at least one non-volatile memory according to the received LSA.

One of the objects, features, and advantages in the present invention is that a volatile memory data cache subsystem is placed between a host and a data storage made of non-volatile memory to reduce data programming to the non-volatile memory, hence prolonging life span of the non-volatile memory in a high endurance non-volatile memory device. Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 4C is a diagram depicting exemplary data structures of a first page of each block of non-volatile memory in accordance with one embodiment of the present invention;

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Used herein, the terms "upper", "lower", "top", "bottom", "middle", "upwards", and "downwards" are intended to provide relative positions for the purposes of description, and are not intended to designate an absolute frame of reference. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-10B. However, those skilled in the art will readily appreciate that the detailed description given herein with respect to these figures is for explanatory purposes as the invention extends beyond these limited embodiments.

Figure 1A:
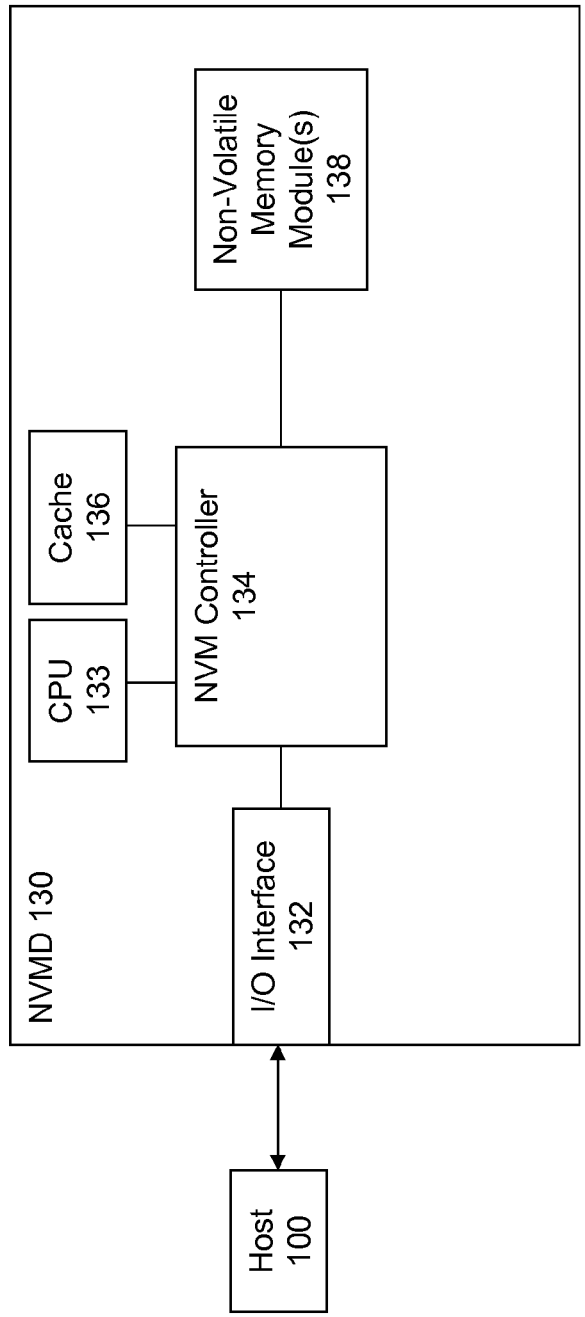
FIG. 1A is a simplified block diagram showing a first exemplary high endurance non-volatile memory device (NVMD) adapting to a host computer in accordance with one embodiment of the presented invention.

Referring now to the drawings, FIG. 1A is a functional block diagram showing salient components of a first exemplary high endurance flash memory device (NVMD) 130 may be deployed as a data storage for the host computer system 100 in accordance with one embodiment of the present invention. The NVMD 130 comprises at least one microprocessor or central processing unit (CPU) 133, an input/output (I/O) controller 132, a non-volatile memory (NVM) controller 134, a data cache subsystem 136 and at least one non-volatile memory module 138.

When the NVMD 130 is adapted to the host computer system 100, the I/O interface 132 is operable to ensure that data transfer between the host 100 and the at least one non-volatile memory module 138 through one of the industry standards including, but not limited to, Advanced Technology Attachment (ATA) or Parallel ATA (PATA), Serial ATA (SATA), Small Computer System Interface (SCSI), Universal Serial Bus (USB), Peripheral Component Interconnect (PCI) Express, ExpressCard, fiber channel Interface, optical connection interface circuit, Secure Digital. The CPU 133 comprises a general purpose processing unit (e.g., a standalone chip or a processor core embedded in a system on computer (SoC)) configured for executing instructions loaded on the main storage (e.g., main memory (not shown)). The NVM controller 134 is configured to manage data transfer operations between the host computer system 100 and the at least one non-volatile memory module 138. Types of the data transfer operations include data reading, writing (also known as programming) and erasing. The data transfer operations are initiated by the host 100. Each of the data transfer operations is accomplished with a logical address (e.g., logical sector address (LSA)) from the host 100 without any knowledge of the physical characteristics of the NVMD 130.

The data cache subsystem 136 comprises of volatile memory such as random access memory (e.g., dynamic random access memory (DRAM)) coupled to the CPU 133 and the NVM controller 134. The cache subsystem 136 is configured to hold or cache either incoming or outgoing data in data transfer operations to reduce number of data writing/programming operations directly to the at least one non-volatile memory module 138. The cache subsystem 136 includes one or more levels of cache (e.g., level one (L1) cache, level two (L2) cache, level three (L3) cache, etc.). The cache subsystem 136 may use one of the mapping schemes including direct mapping, fully associative and N-set (N-way) associative. N is a positive integer greater than one. According to one aspect, the cache subsystem 136 is configured to cover the entire range of logical address, which is mapped to physical address of the at least one non-volatile memory module 138.

Each of the at least one non-volatile memory module 138 may include at least one non-volatile memory chip (i.e., integrated circuit). Each chip includes one or more planes of flash cells or arrays. Each plane comprises an independent page register configured to accommodate parallel data transfer operations. Each plane of the non-volatile memory chip is arranged in a data structure as follows: Each of the chips is divided into a plurality of data blocks and each block is then partitioned into a plurality of data pages. Each of the pages may contain one or more addressable data sectors in a data area and other information such as error correcting code (ECC) in a spare area. The data erasing in the non-volatile memory is perform in a data block by data block basis, while the data reading and writing can be performed for each data sector. The data register is generally configured to hold one data page including both data and spare areas. The non-volatile memory may include, but not be limited to, SLC flash memory (SLC), MLC flash memory (MLC), phase-change memory, Magnetoresistive random access memory, Ferroelectric random access memory, Nano random access memory.

Figure 1B:
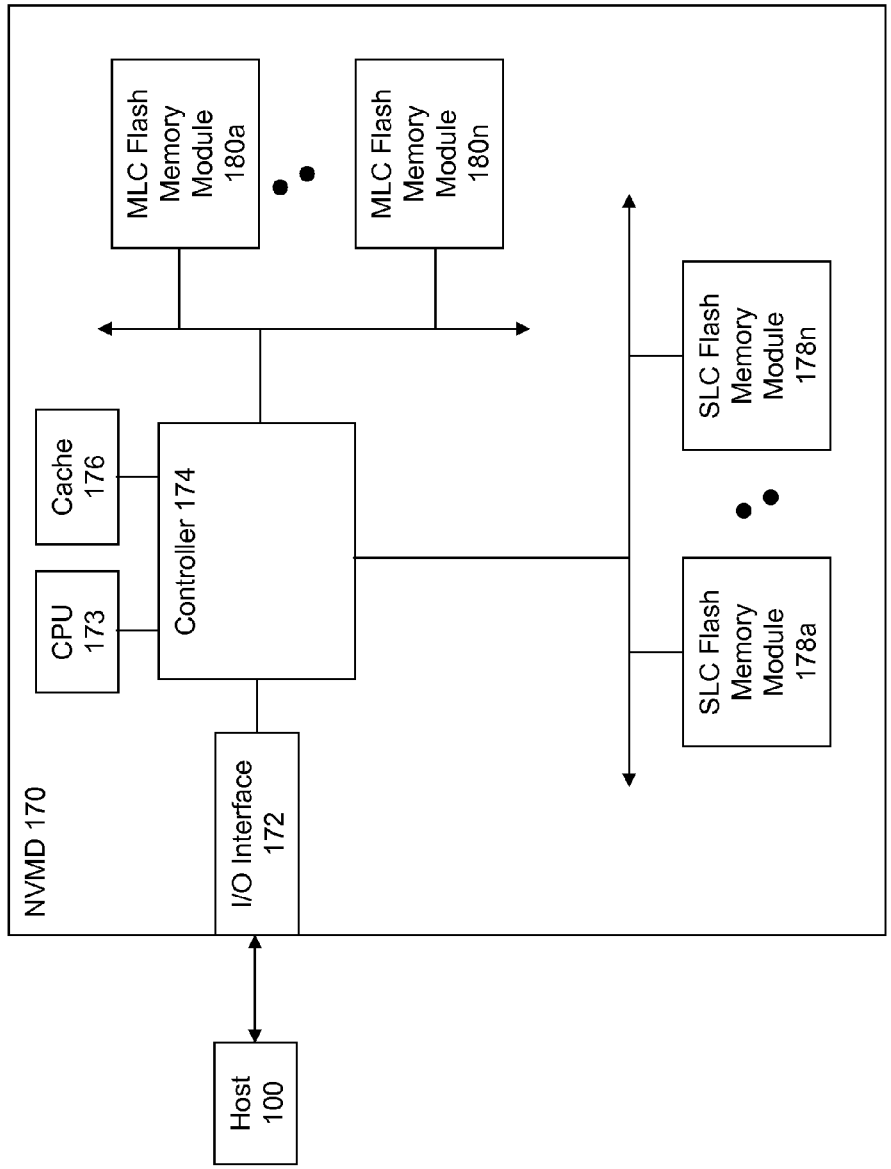
FIG. 1B is a simplified block diagram showing a second exemplary high endurance non-volatile memory device (NVMD) adapting to a host computer in accordance with one embodiment of the presented invention.

A second exemplary high endurance NVMD 170 is shown in FIG. 1B, according to another embodiment of the present invention. Most of the components of the second NVMD 170 are the same as those of the first NVMD 130 except the second NVMD 170 includes two types of flash memory modules: SLC 178a-n and MLC 180a-n. The SLC and MLC flash memory modules are configured in a hierarchical scheme with the SLC 178a-n placed between the cache subsystem 176 and the MLC 180a-n, while the SLC and MLC flash memory modules are collectively provided as a data storage device to the host computer 100. A copy of the data cached in the cache subsystem 176 is stored in the SLC 178a-n such that the most-recently used data are accessed without accessing the MLC 180a-n, hence reducing the number of data writing or programming directly into the MLC 180a-n.

Figure 1C:
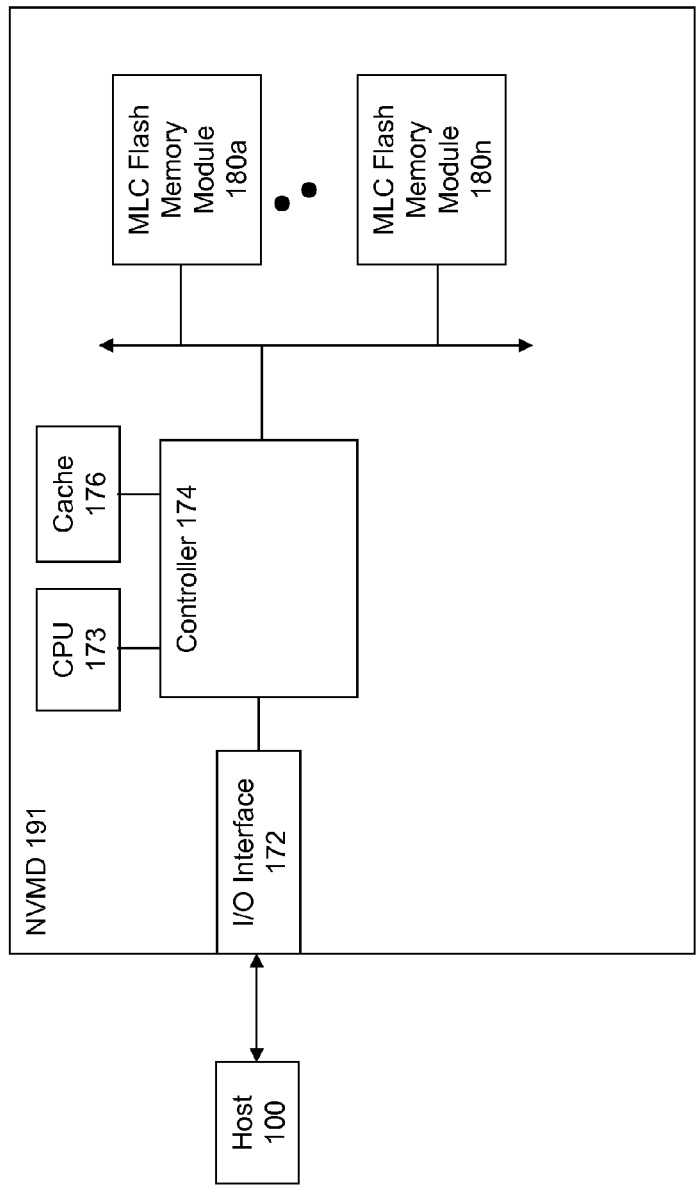
FIG. 1C is a simplified block diagram showing a third exemplary high endurance non-volatile memory device (NVMD) adapting to a host computer in accordance with one embodiment of the presented invention.
Figure 1D:
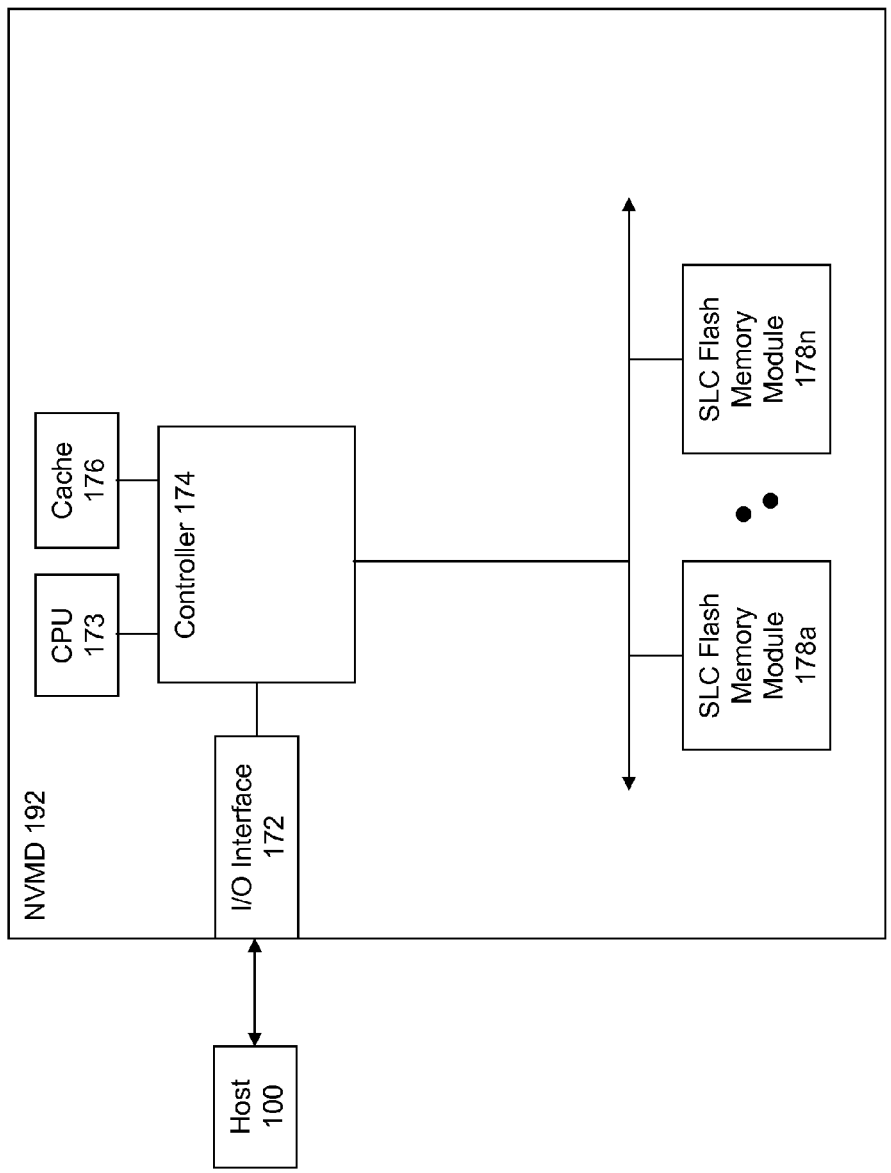
FIG. 1D is a simplified block diagram showing a fourth exemplary high endurance NVMD adapting to a host computer system in accordance with one embodiment of the presented invention.

According to another embodiment, a third exemplary NVMD 191 is shown in FIG. 1C. The third NVMD 191 is similar to the second NVMD 170 of FIG. 1B except there is no SLC. FIG. 1D shows a fourth exemplary NVMD 192 in accordance with yet another embodiment. The fourth NVMD 192 is also similar to the second NVMD 170 except there is no MLC.

Figure 1E:
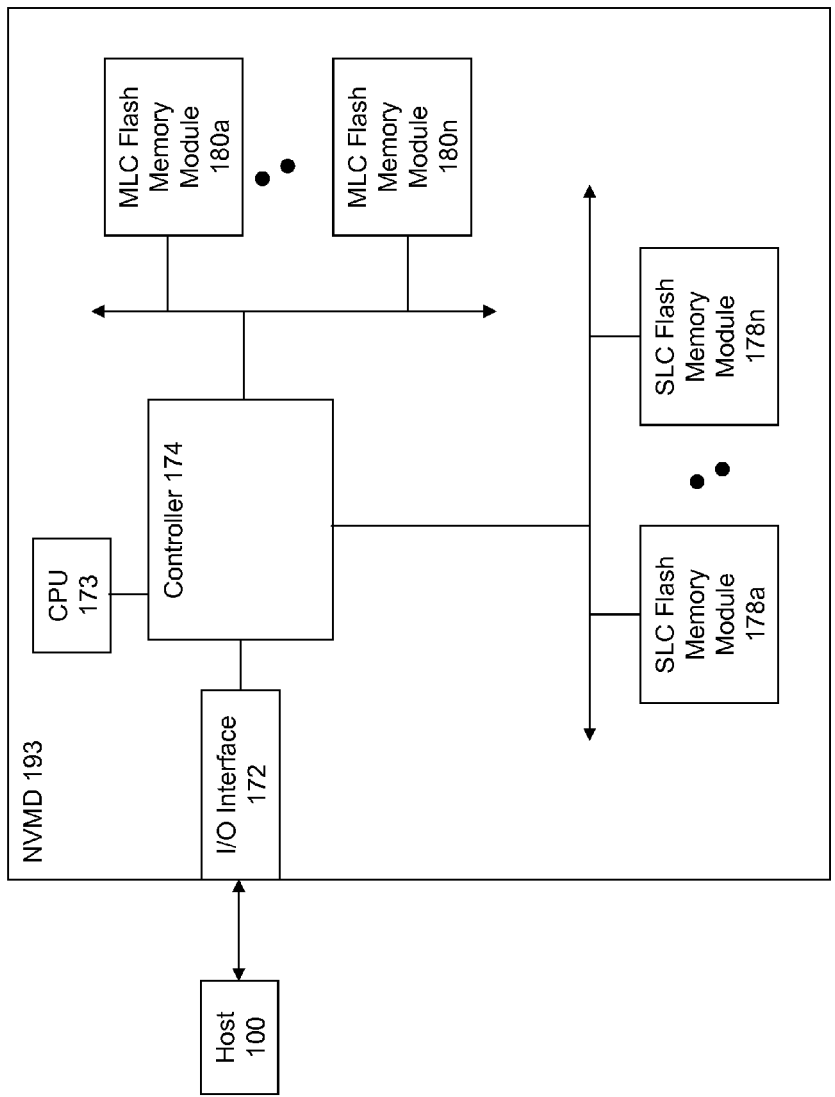
FIG. 1E is a simplified block diagram showing a fifth exemplary high endurance NVMD adapting to a host computer system in accordance with one embodiment of the present invention.

FIG. 1E is a simplified block diagram showing a fifth exemplary NVMD 193 according to yet another embodiment of the present invention. The NVMD 193 comprises similar components with other exemplary NVMDs described herein except the fifth NVMD 193 does not contain a volatile memory based data cache subsystem. Instead, the fifth NVMD 193 comprises at least one SLC flash memory module 178a-n (SLC) and at least one MLC flash memory module 180a-n (MLC). The total capacity of the data storage provided by the fifth NVMD 193 is the combined capacity of the SLC 178a-n and the MLC 180a-n. The SLC 178a-n and the MLC 180*a-n* are arranged in a hierarchical scheme such that the SLC 178*a-n* is placed closer to the host computer system 100. The MLC 180*a-n* is only written after the SLC 178*a-n* has been used up to its predefined capacity.

Figure 1F:
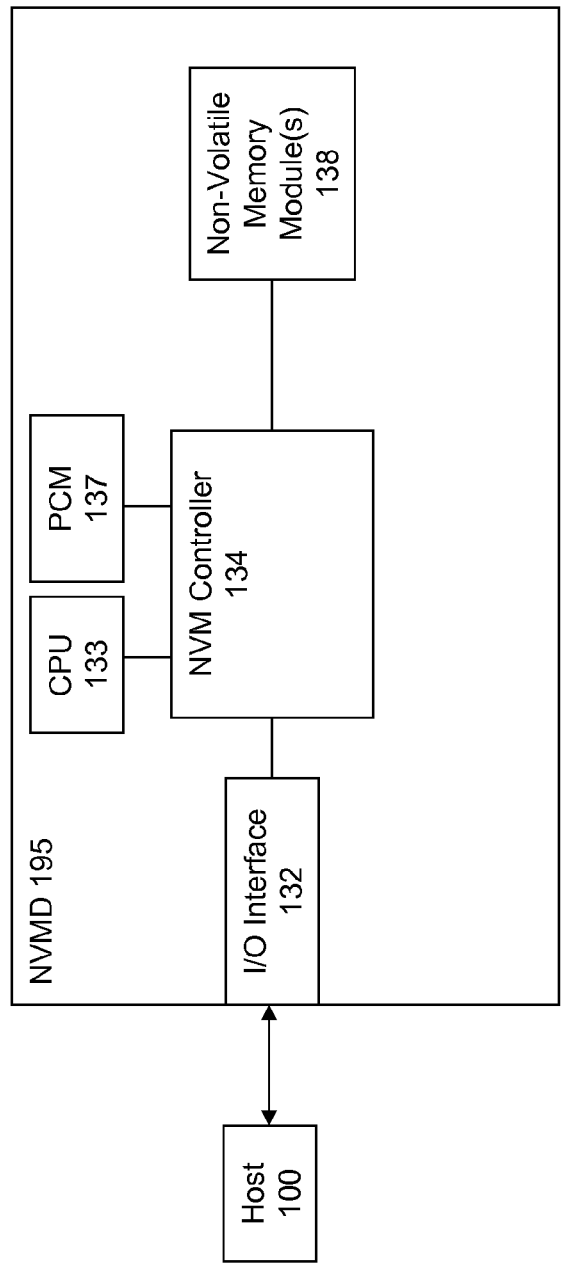
FIG. 1F is a simplified block diagram showing a sixth exemplary high endurance NVMD adapting to a host computer system in accordance with one embodiment of the presented invention.

FIG. 1F shows a sixth exemplary NVMD 195 according to yet another embodiment of the present invention. The sixth NVMD 195 is similar to the first NVMD 130 with phase-change memory (PCM) 137 used in the data cache subsystem 136.

Figure 2A:
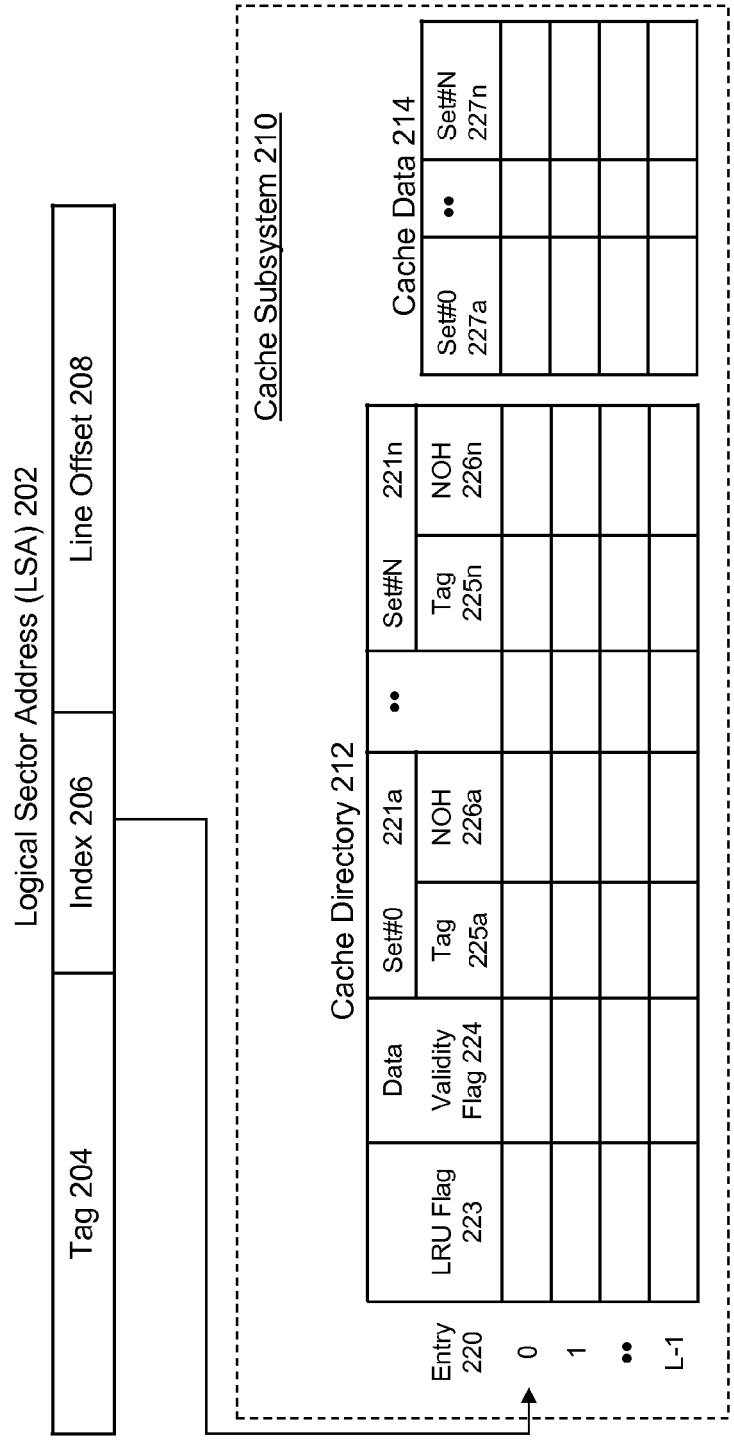
FIG. 2A is a diagram depicting relationship between an exemplary cache subsystem and a logical sector address in accordance with one embodiment of the present invention.

FIG. 2A shows the relationship between a logical section address (LSA) 202 and an exemplary data cache subsystem 210 in accordance with one embodiment of the present invention. LSA is partitioned into a tag 204, an index 206 and a line offset 208. The cache subsystem 210 comprises cache directory 212 and cache data 214. The cache subsystem 210 is configured using an N-set associative mapping scheme. N is a positive integer greater than one. The cache directory 212 comprises a plurality of cache entries 220 (e.g., L entries shown as 0 to (L−1)). Each of the cache entries 220 comprises N sets or ways (e.g., 'set#0' 221*a* . . . 'set#N' 221*n*) of cache line. Each set 221*a-n* of the cache lines comprises a tag field 225*a-n*, a number-of-write-hits (NOH) field 226*a-n*, and data field 227*a-n*. In addition, a least-recently used (LRU) flag 223 and a data validity flag 224 are also included for each entry in the cache directory 212. The LRU flag 223 is configured as an indicator to identify which one of the N sets of cache line is least-recently used. The data validity flag 224 is configured to indicate whether the cached data is valid (i.e., identical content with the stored data in the at least one non-volatile memory).

The relationship between the LSA 202 and the cache subsystem 210 is as follows: First, the index 206 of the LSA 202 is used for determining which entry of the cache directory 212 (e.g., using the index 206 as the entry number of the cache directory 212). Next, based on the data validity flag 224 and the LRU flag 223, one of the N sets 227*a-n* of the cache line is selected to store the data associated with the LSA 202. Finally, the tag 204 of the LSA 202 is filled into the respective one of the tag field 226*a-n* corresponding to the selected set of the N sets 227*a-n* of the cache line. The line offset 208 may be further partitioned into block, page and sector offsets that match the data structure of the at least one non-volatile memory in the NVMD 170.

Figure 2B:
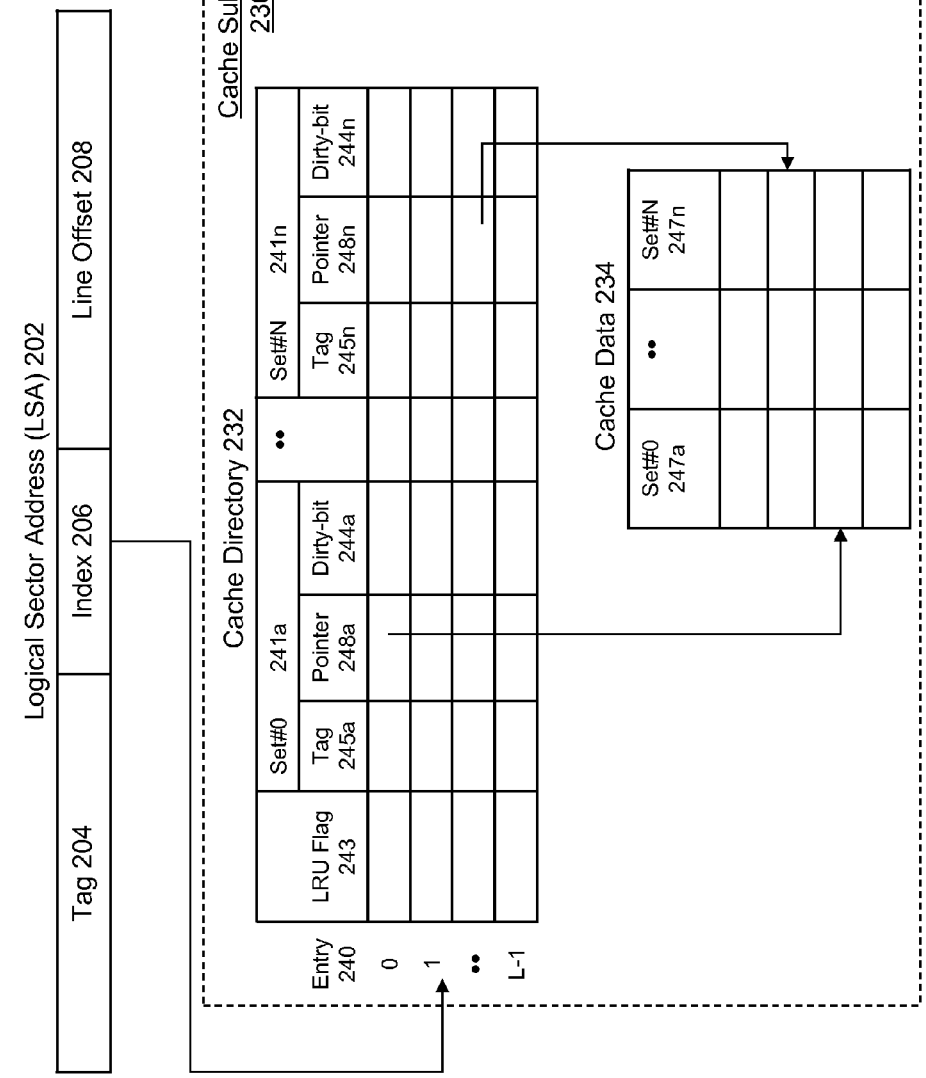
FIG. 2B is a diagram depicting relationship between an alternative exemplary cache subsystem and a logical sector address in accordance with one embodiment of the present invention.

According to another embodiment, an alternative cache subsystem 230 is shown in FIG. 2B. Similar to the cache system 210, the alternative cache subsystem 230 comprises a cache directory 232 and a cache data 234. The cache directory 232 comprises a plurality of entries 240. Instead of the data validity flag 224, a 'dirty-bit' flag 244*a-n* is included in each set of the cache directory 232. The 'dirty-bit' flag 244*a-n* is used for indicating the cached data has been modified. The 'dirty-bit' flag 244*a-n* may be used in a 'write-back' cache data operation. There is no NOH flag 226*a-n*. An indirect addressing pointer 248*a-n* is stored with each set of the N sets 241*a-n* of the cache line. Each of the pointers 248*a-n* points to actual location of the cached data for respective set of the N sets of the cache line in the cache data 234.

Figure 3A:
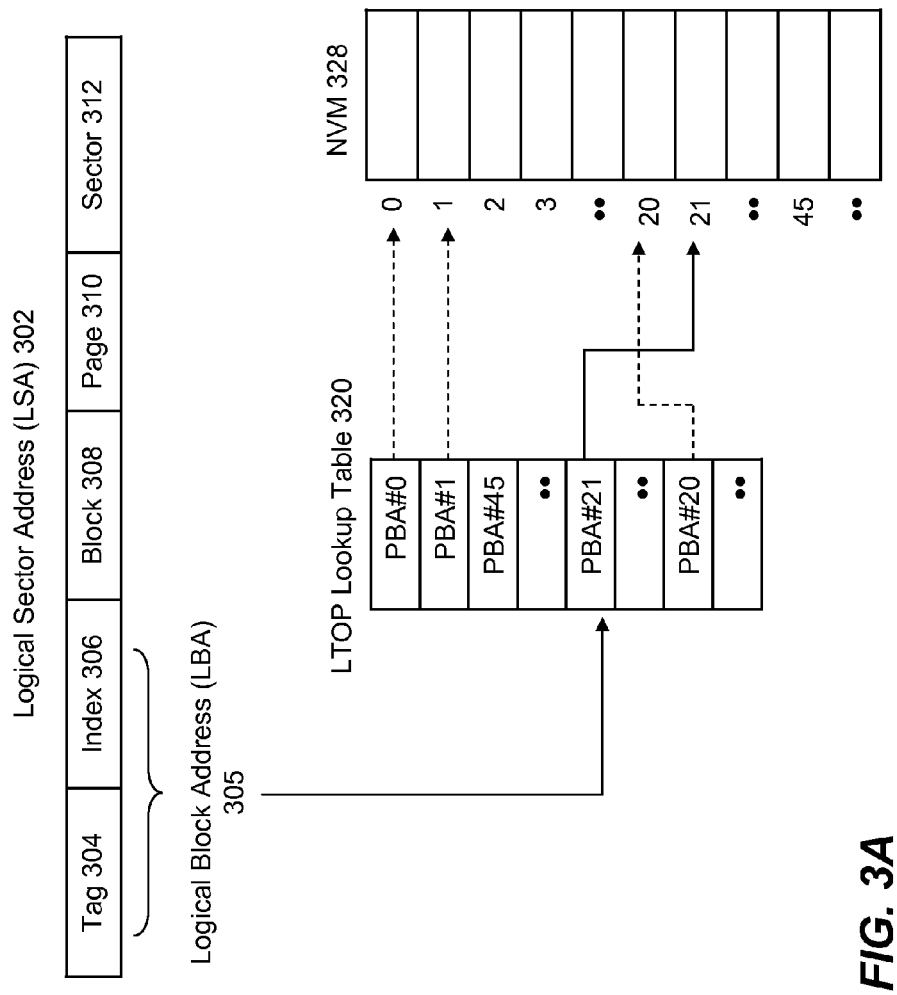
FIG. 3A is a diagram illustrating relationship between a logical sector address and physical address of the non-volatile memory in the NVMD of FIG. 1A.

FIG. 3A is a diagram showing the relationship between a logical sector address (LSA) 302 and physical address of the at least one non-volatile memory 328 of the NVMD 130 of FIG. 1A. LSA 302 is partitioned into a tag 304, an index 306, a block offset 308, a page offset 310 and a sector offset 312. Combining the tag 306 and the index 306 results into a logical block address (LBA) 305. Each LBA 305 is mapped to a unique physical block address of the non-volatile memory 328. The logical to physical address correlation is kepted in a 'logical-to-physical' (LTOP) block address lookup table 320. For example, the LBA 305 is mapped to a physical block address, 'PBA#21', in the LTOP lookup table 320. Data block associated with the LSA 302 is stored in a physical block of the NVM 328 at physical block address 'PBA#21', which is shown in a solid line between the LTOP lookup table 320 and the NVM 328. The broken or dotted lines show other one-to-one relationships.

Figure 3B:
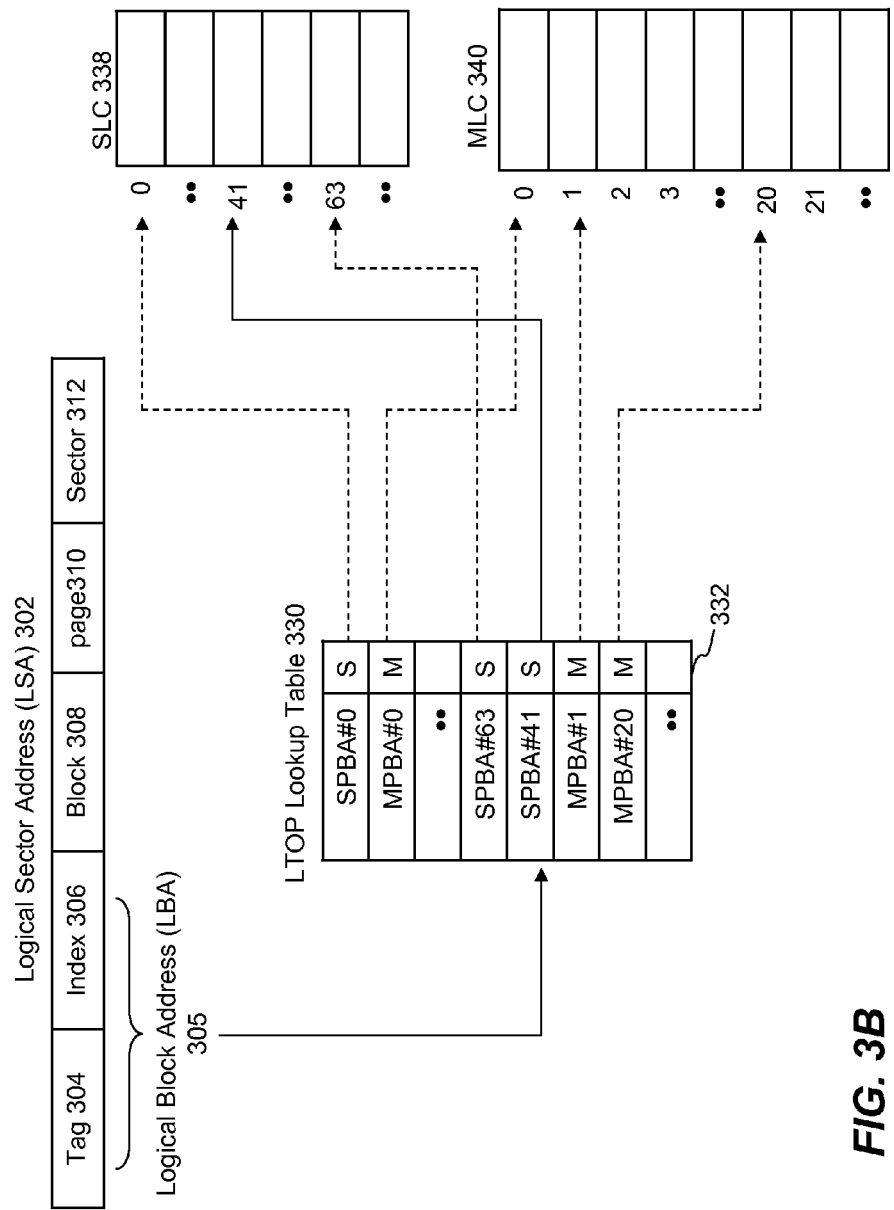
FIG. 3B is a diagram illustrating relationship between a logical sector address to physical address of the non-volatile memory in the NVMD of FIG. 1B.

FIG. 3B shows another diagram showing the relationship between LSA and NVM of the NVMD 170 in FIG. 1B. Since there are two types of flash memory (i.e., SLC 338 and MLC 340), the LTOP lookup table 330 includes an additional field (S/M) 332 in each entry to indicate whether the respective physical block address is for the SLC 338 or the MLC 340. It is noted that the LBA 305 is mapped to the combined storage space of the SLC 338 and MLC 340 in LTOP lookup table 330 in FIG. 3B. In this example, the LBA 305 is mapped to physical block address 'SPBA#41' in the SLC 338, which is shown as a solid line. Dotted or broken lines represent other one-to-one relationship between logical block address space and the combined physical block address space.

LSA is describe with a numerical example is shown below. A host (e.g., the host computer system 100) accesses a non-volatile memory (e.g., NVM 138) comprising 4 giga-byte (4 GB) of data including 8096 blocks. Each of the blocks is divided into 128 pages, and each page eight sectors. Each sector contains 512-byte of data. Should the host need to address the entire storage space in bytes, a 32-bit address would be used. Since 512-byte sector is a basic unit for the non-volatile memory, only 23-bit is required with the first 9-bit as the tag, the next 4-bit as the index followed by a 7-bit page offset (i.e., 128 pages) with a 3-bit sector offset (i.e., 8 sectors). Combining the tag and the index results into a 13-bit logical block address (LBA).

Figure 4A:
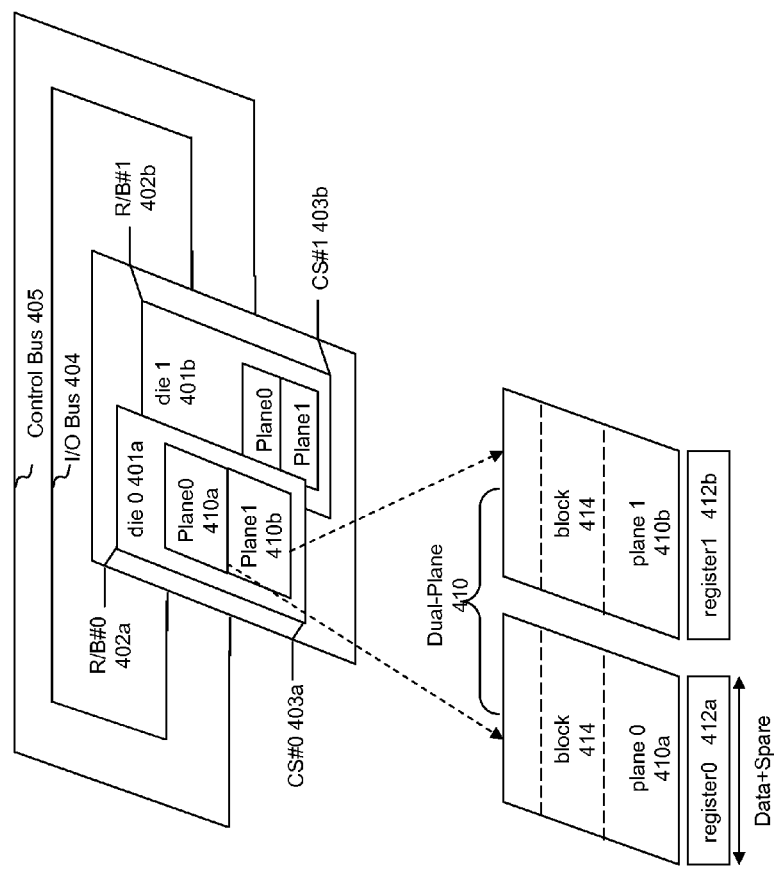
FIG. 4A is a diagram showing an exemplary non-volatile memory chip in accordance with one embodiment of the present invention.

Physical structure of an exemplary non-volatile memory is shown in FIG. 4A, which depicts an exemplary non-volatile memory chip or integrated circuit 400. The non-volatile memory chip 400 comprises two dies (i.e., 'die 0' 401*a* and 'die 1' 401*b*) stackedly connected to each other using a stacked chip scale package (S-CSP) technology. Each of the dies contains two planes (i.e., dual-plane 410 'plane 0' 410*a* and 'plane 1' 410*b*). Dividing memory arrays or cells on the non-volatile memory chip into two independent planes allows a NVM controller (e.g., NVM controller 174 of FIG. 1B) to perform two independent data transfer operations, for example, reading data from one plane, while programming (writing to) or erasing the other plane. In order to perform parallel data transfer, each of the dual-plane 410 comprises a page register (i.e., 'register0' 412*a* and 'register1' 412*b*). Each page register has a size equal to a sum of data and spare area. The data area is configured for storing a plurality of data sectors while the spare area for other information such as error correcting code, logical block address, etc. Each plane contains a plurality of data blocks 414.

Pins configured on each die of the non-volatile memory chip 400 include four logical groups: ready/busy (R/B), chip select (CS), input/output (I/O) and control. Some of the logical groups require only one pin, others more. For example, the ready/busy and the chip select only need one (1) pin each, while the I/O bus may need eight (8) pins. In order to achieve high performance for the high endurance NVMD, the I/O bus 404 and the control bus 405 of 'die 0' 401*a* and 'die 1' 401*b* are wired together. The ready/busy and chip select pins are separately wired (i.e., R/B#0 402*a*, R/B#1 402*b*, CS#0 403*a* and CS#1 403*b*). R/B#0 402*a* is the pin for transmitting the read/busy state of 'die 0' 401*a*; and R/B#1 402*b* is for 'die 1' 401*b*. Pin CS#0 403*a* is for selecting 'die 0' 401*a* and CS#1 403*b* is for 'die 1' 401*b*. In other words, 'die 0' 401*a* and 'die 1' 401*b* are wired in such way that each die may be selected separately for data transfer operations.

Figure 4B:
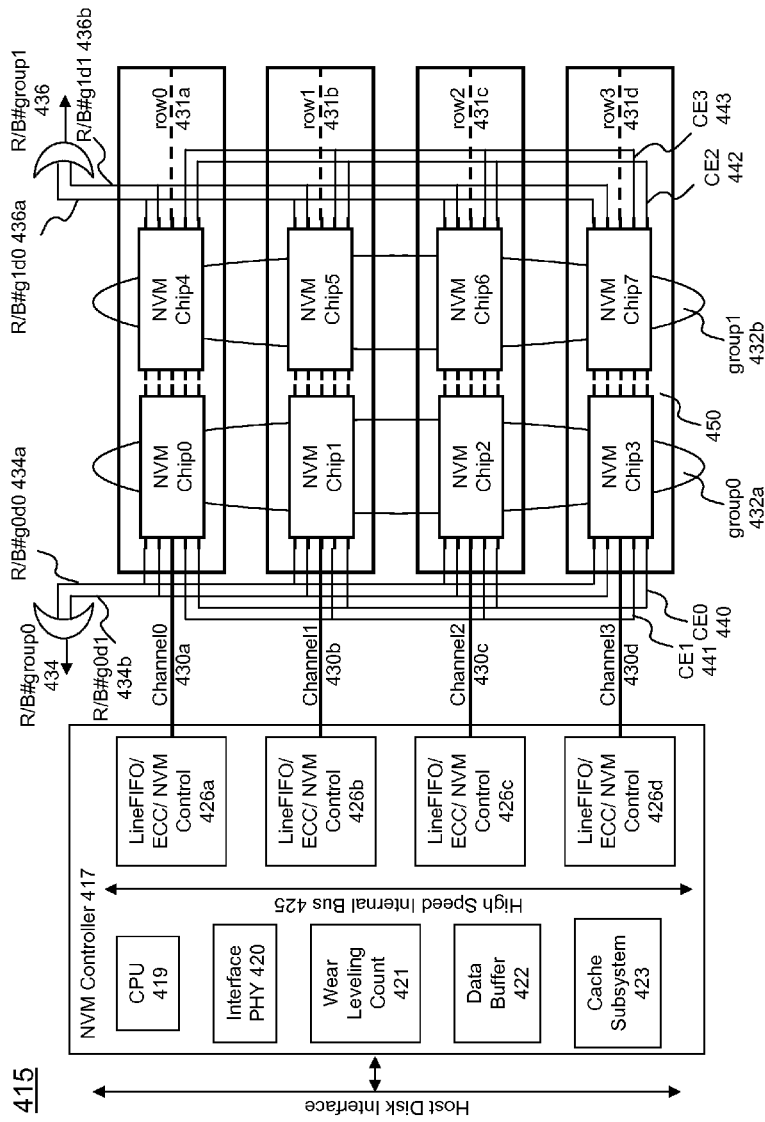
FIG. 4B is a schematic diagram showing an exemplary non-volatile memory module connecting to exemplary parallel data buffers via multiple independent data channels, according to an embodiment of the present invention.

FIG. 4B is a schematic diagram 415 showing an exemplary non-volatile memory module 450 connecting to exemplary parallel line (First-In-First-Out) FIFO buffers 426*a-d* via multiple independent data channels 430*a-d*, according to an embodiment of the present invention. The non-volatile memory module 450 comprises a plurality of non-volatile memory chips (e.g., chip 400 of FIG. 4A, eight shown as 'Chip0', 'Chip1', 'Chip2', 'Chip3', 'Chip4', 'Chip5', 'Chip6', 'Chip7'). The plurality of non-volatile memory chips are divided in two orthogonal schemes: vertical (column-wise) and horizontal (row-wise) in FIG. 4B. In this example, two groups are formed vertically while four rows are formed horizontally. 'group0' 432*a* includes 'Chip0', 'Chip1', 'Chip2' and 'Chip3'; and 'group1' 432*b* includes 'Chip4', 'Chip5', 'Chip6' and 'Chip7'. 'row0' 431*a* contains 'Chip0' and 'Chip4'; 'row1' 431*b* includes 'Chip1' and 'Chip5'; 'row2' 431*c* 'Chip2' and 'Chip6'; and 'row3' 431*d* 'Chip3' and 'Chip7'.

The chips in vertical groups are connected in the following manners:

(1) R/B#g0d0 434*a* connects the R/B#0 pin 402*a* of all chips in 'group0' 432*a*

(2) R/B#g0d1 434*b* connects the R/B#1 pin 402*b* of all chips in 'group0' 432*a*

(3) R/B#g1d0 436*a* connects the R/B#0 pin 402*a* of all chips in 'group1' 432*b*

(4) R/B#g1d1 436*b* connects the R/B#1 pin 402*b* of all chips in 'group1' 432*b*

(5) R/B#group0 434 connects R/B#g0d0 434*a* and R/B#g0d1 434*b* together (6) R/B#group1 436 connects R/B#g1d0 436*a* and R/B#g1d1 436*b* together (7) CE#0 440 connects the CS#0 pin 403*a* of al chips in 'group0' 432*a*

(8) CE#1 441 connects the CS#1 pin 403*b* of al chips in 'group0' 432*a*

(9) CE#2 442 connects the CS#0 pin 403*a* of al chips in 'group1' 432*b*

(10) CE#3 443 connects the CS#1 pin 403*b* of al chips in 'group1' 432*b*

Accordingly, chip enable (CE) signal is selected to enable the chips, for example, CE#0 440 may be selected to enable 'die 0' 401*a* of all of the chips in 'group0' 432*a*, CE#1 to enable 'die 1' 401*b* of all of the chips in 'group0' 432*a*, CE#2 to enable 'die 0' 401*a* of all of the chips in 'group1' 432*b*, and CE#3 to enable 'die 1' 401*b* of all of the chips in 'group1' 432*b*.

The chips in each of the horizontal groups are connected to a respective data channel 430*a-d* (i.e., one of the four shown) as follows:

(1) data channel 'channel0' 430*a* connects all chips in 'row0' 431*a*

(2) data channel 'channel1' 430*b* connects all chips in 'row1' 431*b*

(3) data channel 'channel2' 430*c* connects all chips in 'row2' 431*c*

(4) data channel 'channel3' 430*d* connects all chips in 'row3' 431*d*

Terms "vertical", "horizontal", "column-wise" and "row-wise" used herein are for the purpose of distinctly describing two orthogonal schemes. There is no physical correlation as to how these non-volatile memory chips are orientated. The chips may or may not be aligned vertically or horizontally.

The data channels 430*a-d* and horizontal rows of chips are corresponding to each other such that parallel data transfer can be conducted. A set of parallel line FIFO buffers 426*a-d* is configured to hold data to be transmitted between a data dispatching unit 422 and the non-volatile memory module 450. The NVMD controller 417 is configured to enable properly ordered and most efficient data transfer from the set of data buffers to a specific vertical group of chips (i.e., CE#0-4) in response to the ready/busy signals received. The data dispatching unit 422 is coupled to a high speed internal bus 425. Also coupled to the high speed bus are a CPU 419, an input/output interface 420 (e.g., SATA, PCI-E), a memory for tracking wear leveling of the non-volatile memory 421, a cache subsystem 423.

Figure 7:
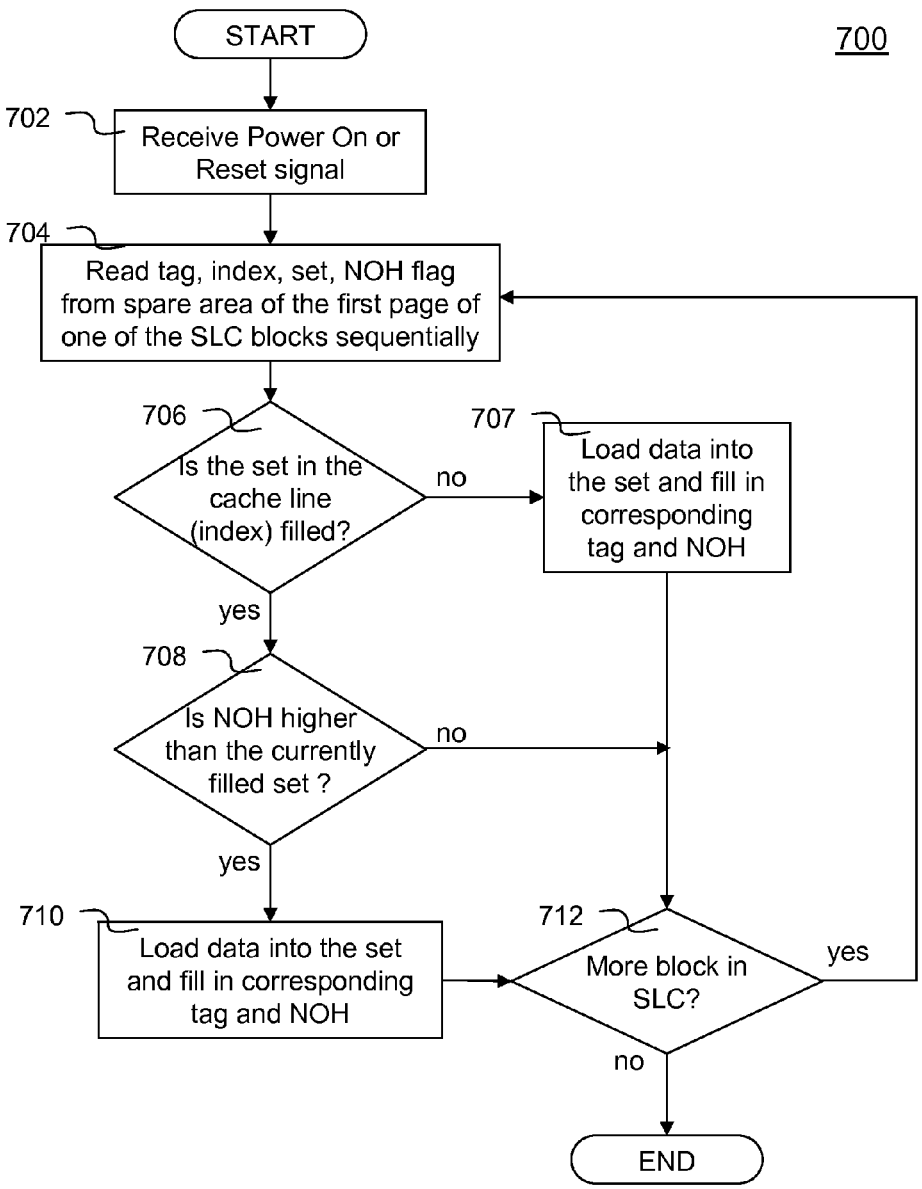
FIG. 7 is a flowchart showing an exemplary process 700 of initialization the cache subsystem during a power up or reset of the NVMD of FIG. 1B in accordance with one embodiment of the present invention.

FIG. 4C is a diagram depicting exemplary data structures of the first data page of each block of non-volatile memory module in accordance with one embodiment of the present invention. A first data structure 450 comprises two portions: data area 451 and spare area 452. The data area 451 comprises a plurality of data sectors 453*a-n* (i.e., 512-byte data sector). The spare area 452 comprises a logical block address (LBA) 454, set number of the N sets of the cache line 455, the NOH flag 456 and other information 458 such as error correcting code (ECC). The LBA 454, the set number 455 and the NOH flag 456 are used for reconstruct the contents of cache subsystem when the NVMD is reset or powered up. The detailed process is shown in FIG. 7 and corresponding descriptions thereof.

A second data structure 460 is substantially similar to the first data structure 450. The difference is that the NOH flag and the set number are not included in the spare area 462. The first data structure 450 is implemented in the SLC while the second data structure 460 is implemented in the MLC, according to one embodiment of the present invention.

Figure 4D:
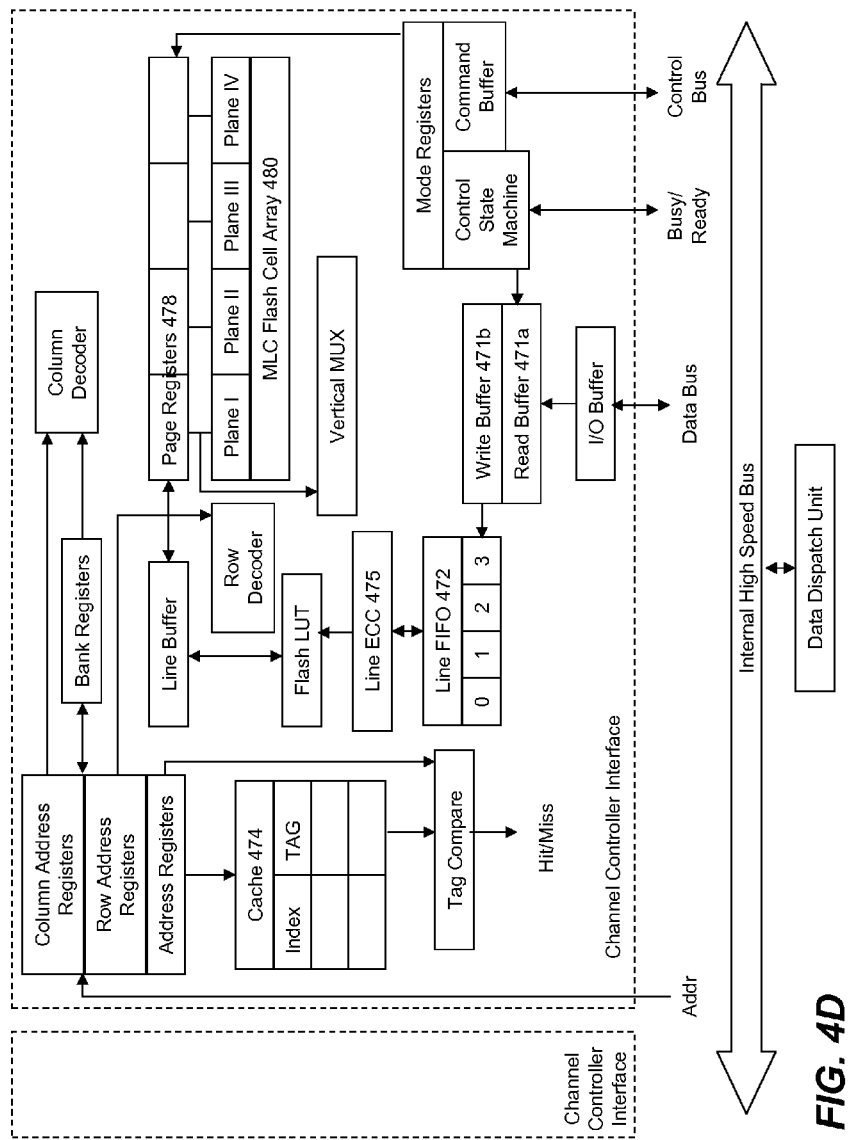
FIG. 4D is a functional block diagram showing page buffers (Line FIFO) and flash memory channel controller in accordance with one embodiment of the present invention.

FIG. 4D is a functional block diagram showing page buffers and flash memory channel controller in accordance with one embodiment of the present invention. Page buffers (e.g., 'buffer0' 424*a* and 'buffer1' 424*b* of FIG. 4B) include a read page buffer 471*a* and a write page buffer 471*b*, which couple to a line FIFO buffer 472. A cache subsystem is shown as a cache directory 474 including tag and index for a plurality of cache lines. A MLC flash cell array 480 represents the at least one NVM. The MLC flash cell array includes four planes, for example, two planes per die and two dies per chip as shown in FIG. 4A. Each of the planes includes a page register 478 (e.g., 'register0' 412*a* or 'register1' 412*b* of FIG. 4A).

FIGS. 5A-5H collectively is a flowchart illustrating an exemplary process 500 of a data transfer operation in the high endurance NVMD 170 of FIG. 1B, according to an embodiment of the present invention. The process 500 is preferably understood with previous figures especially FIG. 2A and FIG. 3B.

The process 500 starts with an 'IDLE' state until the NVMD receives a data transfer request from a host computer system (e.g., the host 100) at 502. Along with the data transfer request is a logical sector address (LSA) 202 and type of the data transfer request (i.e., data read or write). Next, at 504, process 500 extracts a tag 204 and an index 206 from the received LSA 202. The received index 206 corresponds to the entry number of the cache directory while the received tag 204 is used for comparing with all of the tags 225*a-n* in that cache entry. The process 500 moves to decision 506 to determine whether there is a 'cache-hit' or a 'cache-miss'. If any one of the tags in the N sets of cache entries matches the received tag 204, a 'cache-hit' condition is determined, which means data associated with the received LSA 202 in the data transfer request is already stored in the cache subsystem 210. Otherwise, if none of the tags 225*a-n* matches the received tag, a 'cache-miss' condition is determined, which means that the data associated with the received LSA 202 is not currently stored in the cache subsystem 210. The data transfer operation for these two conditions are very different in the high endurance NVMD 170.

After decision 506, the process 500 checks the data transfer request type at decision 508 to determine whether a data read or write operation is requested. If 'cache-miss' and 'data read', the process 500 continues to the steps and decisions in FIG. 5B. If 'cache-miss' and 'data write', the process 500 goes to the steps and decisions in FIG. 5G. If 'cache-hit' and 'data write', the process 500 moves to the steps and decisions in FIG. 5E.

Otherwise in a 'cache-hit' and 'data read' condition, the process 500 updates the least-recently used (LRU) flag 223 at 512. Next, at 514, the process 500 retrieves the requested data from the 'cache-hit' set of the N sets of the cache line with the line offset 208, which is an offset for a particular page and/or sector in the received LSA 202 and then sends the retrieved data back to the host 100. The process 500 goes back to the 'IDLE' state for waiting for another data transfer request.

Figure 5A:
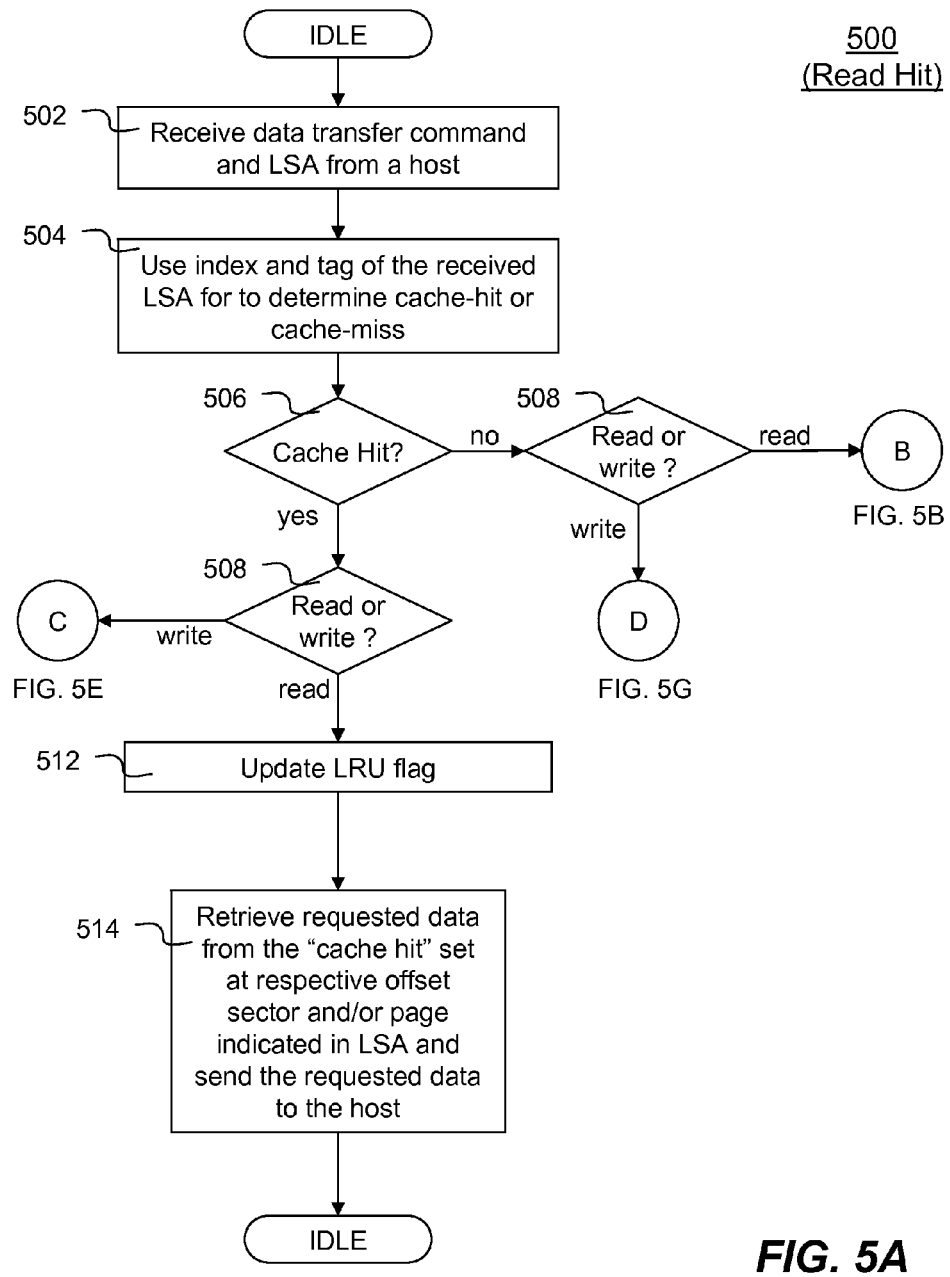
FIGS. 5A-5H collectively is a flowchart illustrating an exemplary process of a data transfer operation in the high endurance NVMD of FIG. 1B, according to an embodiment of the present invention.
Figure 5B:
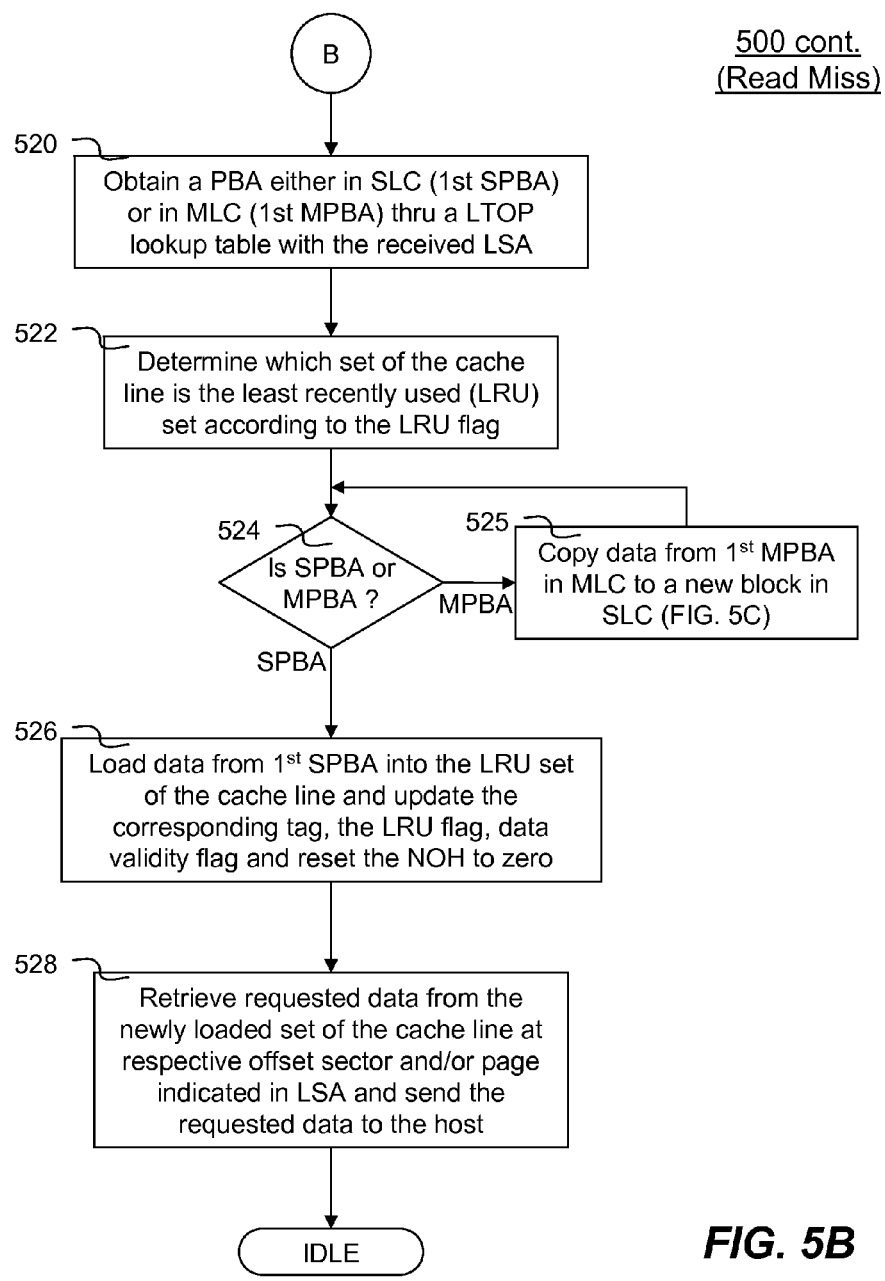

For the case of 'cache-miss' and 'data read' shown in FIG. 5B, the process 500 obtains a physical block address either in the SLC (e.g., SLC 338 of FIG. 3B) or in the MLC (e.g., 340 of FIG. 3B) that maps to the logical block address (LBA) 305 (i.e., tag plus index in the received LSA) through the LTOP lookup table 330 at 520. Next, the least-recently used set is determined according to the LRU flag stored in the cache directory at 522. Then at decision 524, it is determine whether the physical block address of the requested data is located in the SLC (SPBA) or the MLC (MPBA). If the requested data is in the MLC, the process 500 moves to 525, in which the requested data is copied from the MLC at the MPBA to a new block in the SLC such that the requested data is found in the SLC. The details of step 525 are described in FIG. 5C.

If at decision 524, it is determines the requested data is stored in the SLC, the request data is loaded from the SLC at the SPBA into the least-recently used set of the cache line at 526. The process 500 also updates the tag 225a-n, the LRU flag 223 and data validity flag 224, and then resets the NOH flag 226a-n to zero, accordingly. Next, at 528, the requested data is retrieved from the just loaded cache line and sent back to the host 100. The process 500 goes back to the 'IDLE' state.

Figure 5C:
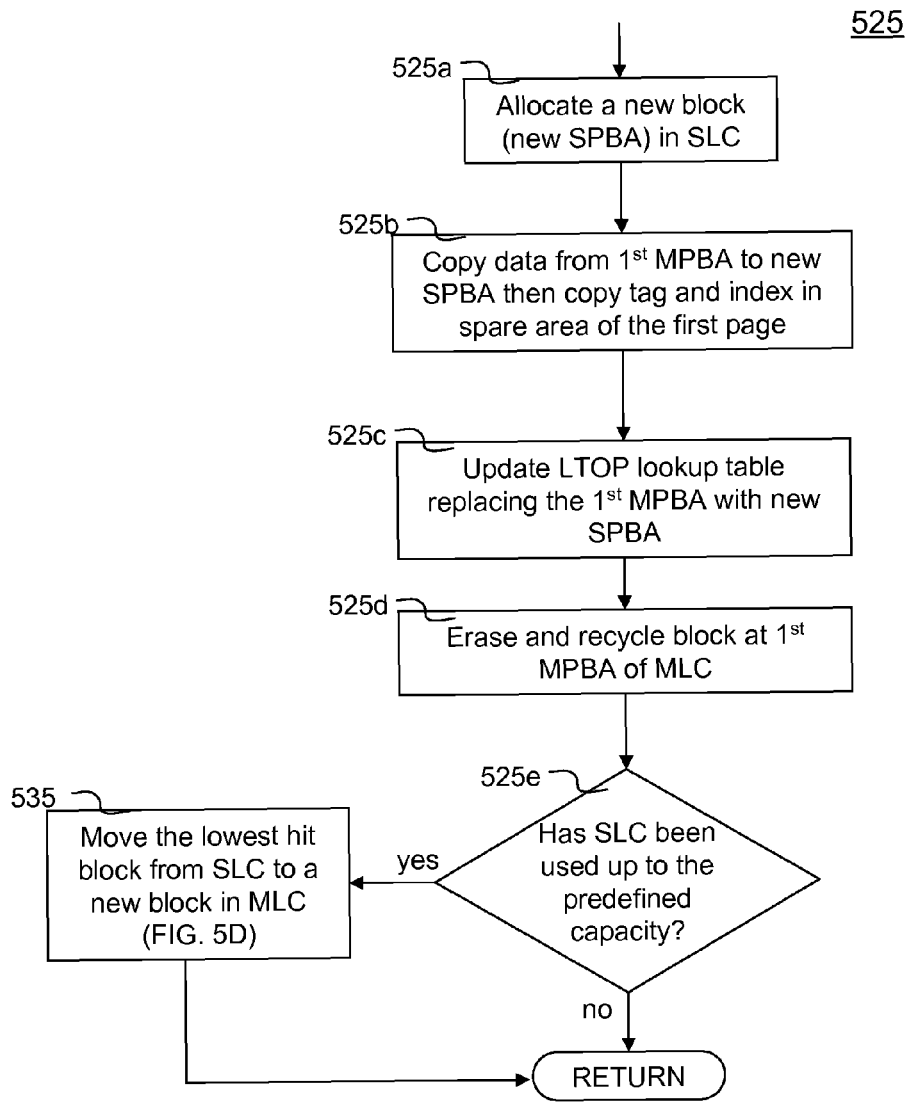

Shown in FIG. 5C is the detail process of step 525. The process 500 allocates a new block (new SPBA) in the SLC at 525a. Next, at 525b, the process 500 copies the data from the physical block address (i.e., old MPBA) in the MLC associated with the received LSA to the new SPBA. Then the process 500 updates the LTOP lookup table with the new SPBA replacing the old MPBA at 525c. At 525d, the block in MLC at the old MPBA is erased for reuse. Then at decision 525e, it is determined whether the SLC has been used up to its predefined capacity. If 'no', the process 500 returns. Otherwise, the process 500 moves the lowest hit block in the SLC to a new block in the MLC at 535 before returning.

Figure 5D:
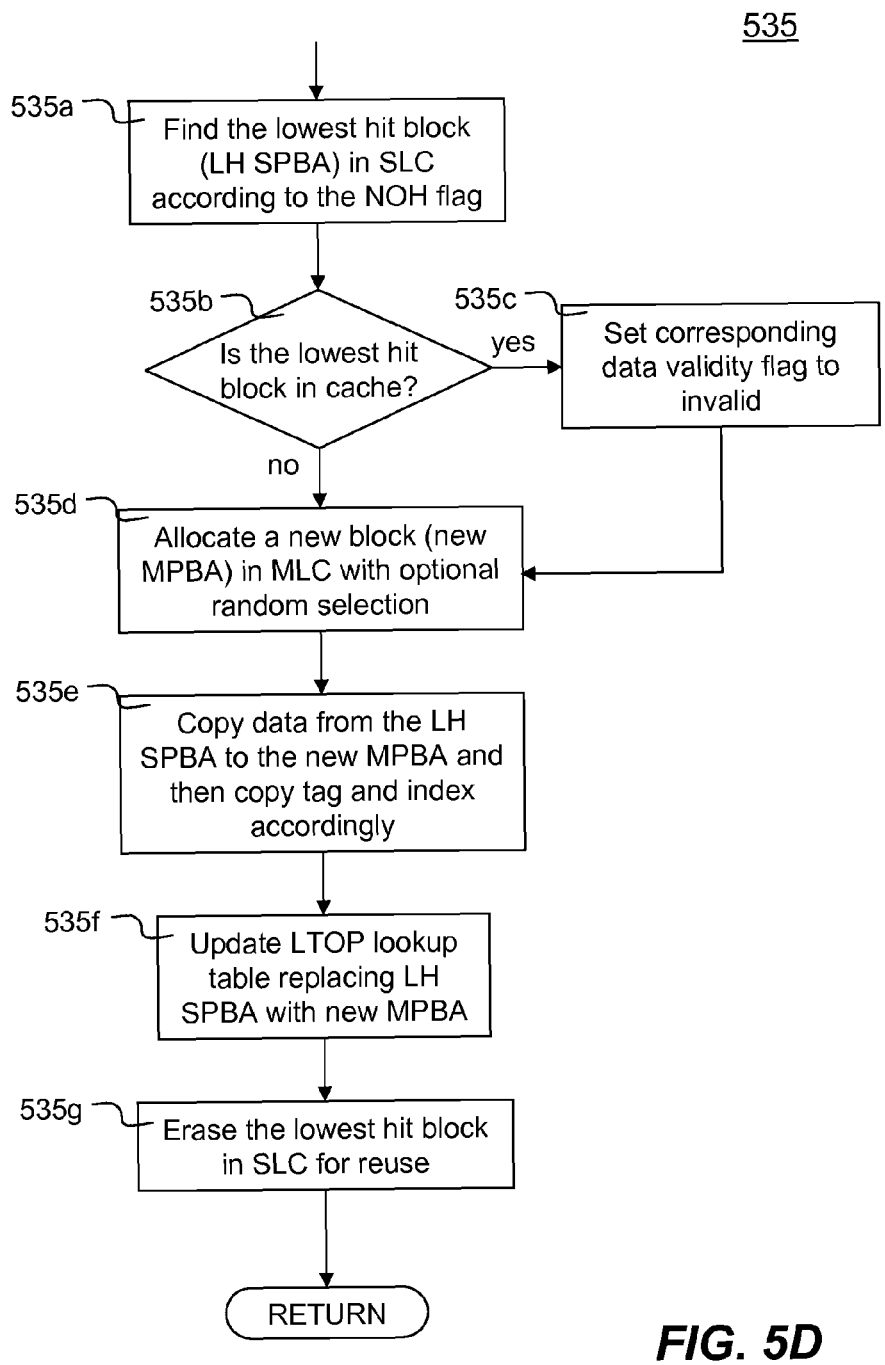

The detailed process of step 535 is shown in FIG. 5D, in which the process 500 first finds the lowest hit block in the SLC (i.e., the block has been least written). To determine the lowest hit block, it may be done by searching through the NOH flag stored in the spare are of the first page of all of the blocks in the SLC at 535a. Next, at decision 535b, it is determined whether the lowest hit block is also loaded in the data cache subsystem. If 'yes', the data validity flag for that cache line is set to invalid at 535c. Otherwise, the process 500 moves directly to 535d by allocating a new block in the MLC. The allocation may be conducted in a number of schemes including, but not limited to, sequentially, randomly. For the random allocation, a probability density function or a cumulative distribution function is used in conjunction with a pseudo random number generator for the selection. Next, at 535e, the process 500 copies the data from the lowest hit block in the SLC to the newly allocated block in the MLC and copy logical address to the spare area of the first page accordingly. At 535f, the LTOP lookup table is updated to reflect the new block in the MLC corresponds to the logical address now instead of the lowest hit block in the SLC. Finally, the lowest hit block in the SLC is erased and available for reuse at 535g.

Figure 5E:
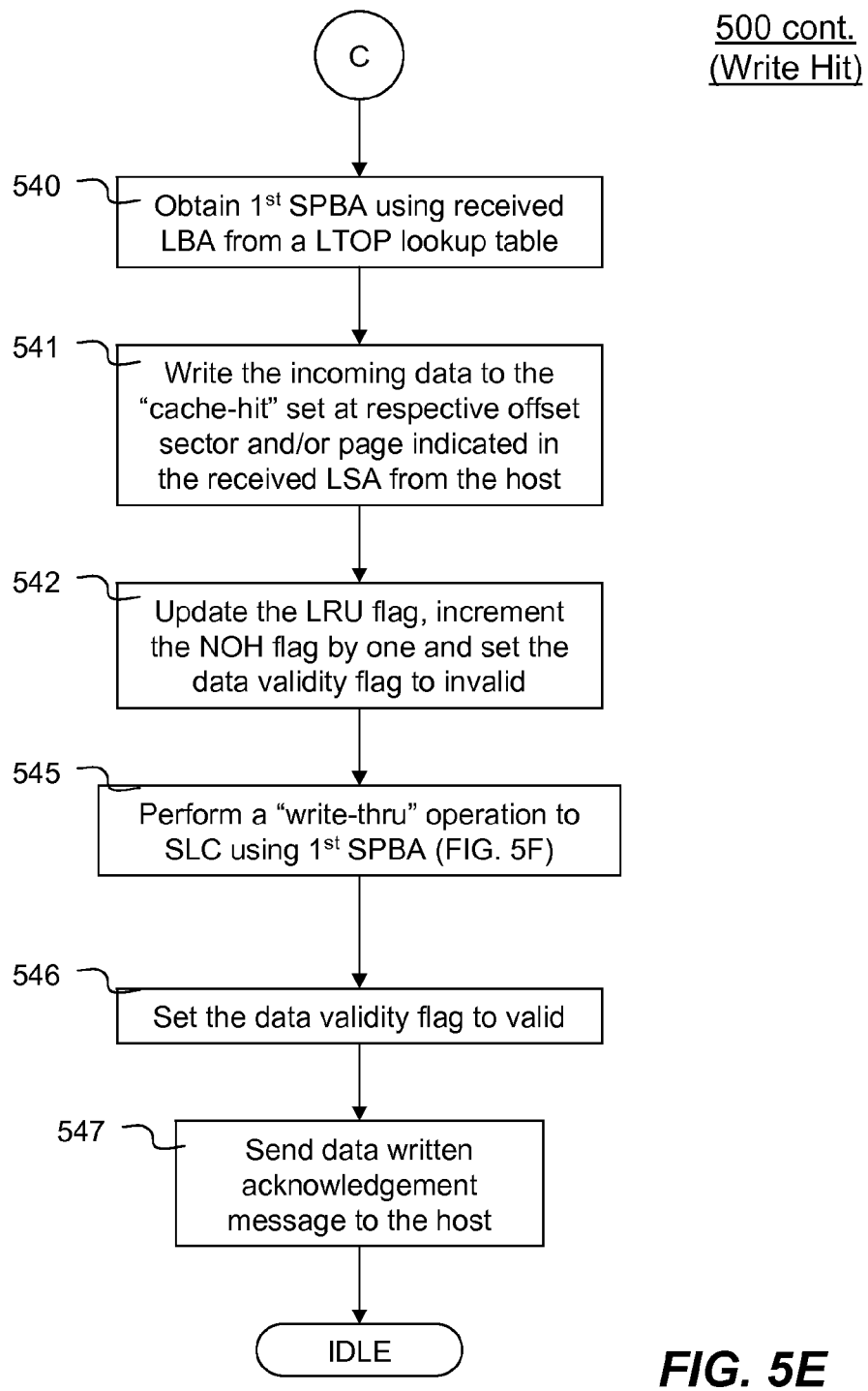

Referring back to the condition of 'cache-hit' and 'data write', the process 500 continues in FIG. 5E. At 540, the process 500 obtains a physical block address based on the received LSA through the LTOP lookup table. Then, at 541, the incoming data is written to the 'cache-hit' set of the cache line. At 542, the process 500 updates the LRU flag, increments the NOH flag by one and sets the data validity flag to invalid. Then, at 545, the process 500 performs a 'write-thru' operation to the SLC using the physical block address obtained in step 540. The details of the step 545 are described in FIG. 5F. After the 'write-thru' operation, the data validity flag is set back to valid at 546. Finally at 547, a data written acknowledgement message or signal is sent back to the host 100 before the process 500 goes back to the 'IDLE' state.

Figure 5F:
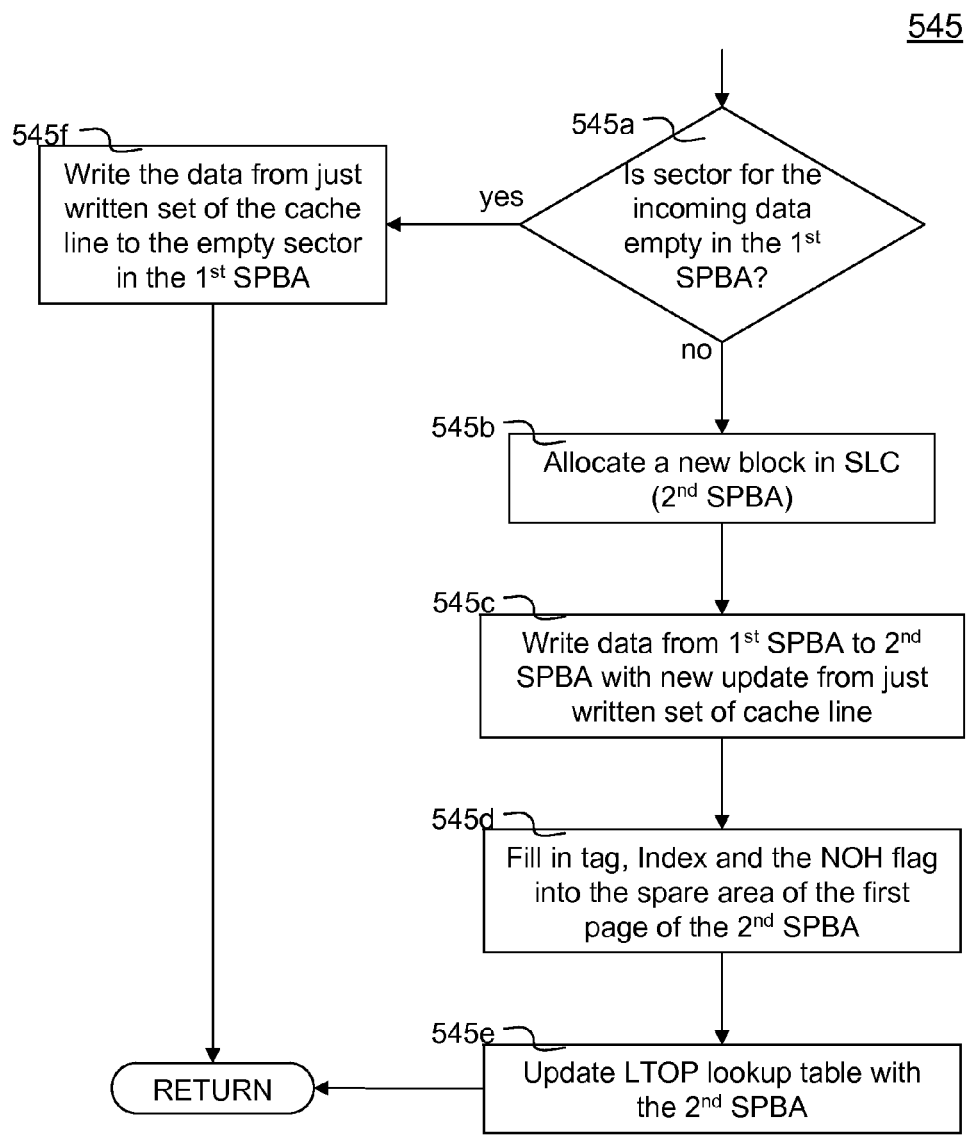

FIG. 5F shows the details of step 545. First at decision 545a, it is determined whether the incoming data is allowed to be directly written in the physical block of the SLC at the obtained physical block address (i.e., $1^{st}$ SPBA). For example, an empty sector in the SLC is allowed to be directly written into. If 'yes', data in the 'cache-hit' set of the cache line is written into the respective location (i.e., sector) in the SLC at the $1^{st}$ SPBA at 545f before returning. Otherwise, the process 500 allocates a new block (i.e., $2^{nd}$ SPBA) in the SLC at 545b. Next, the data is copied from the $1^{st}$ SPBA to the $2^{nd}$ SPBA with the update from the data in the 'cache-hit' set of the cache line at 545c. Then at 545d, the process 500 copies the tag, index, set number and NOH flag to the spare area of the first page of the $2^{nd}$ SPBA accordingly. Finally, at 545g, the LTOP lookup table is updated with the $2^{nd}$ SPBA before the process 500 returns.

Figure 5G:
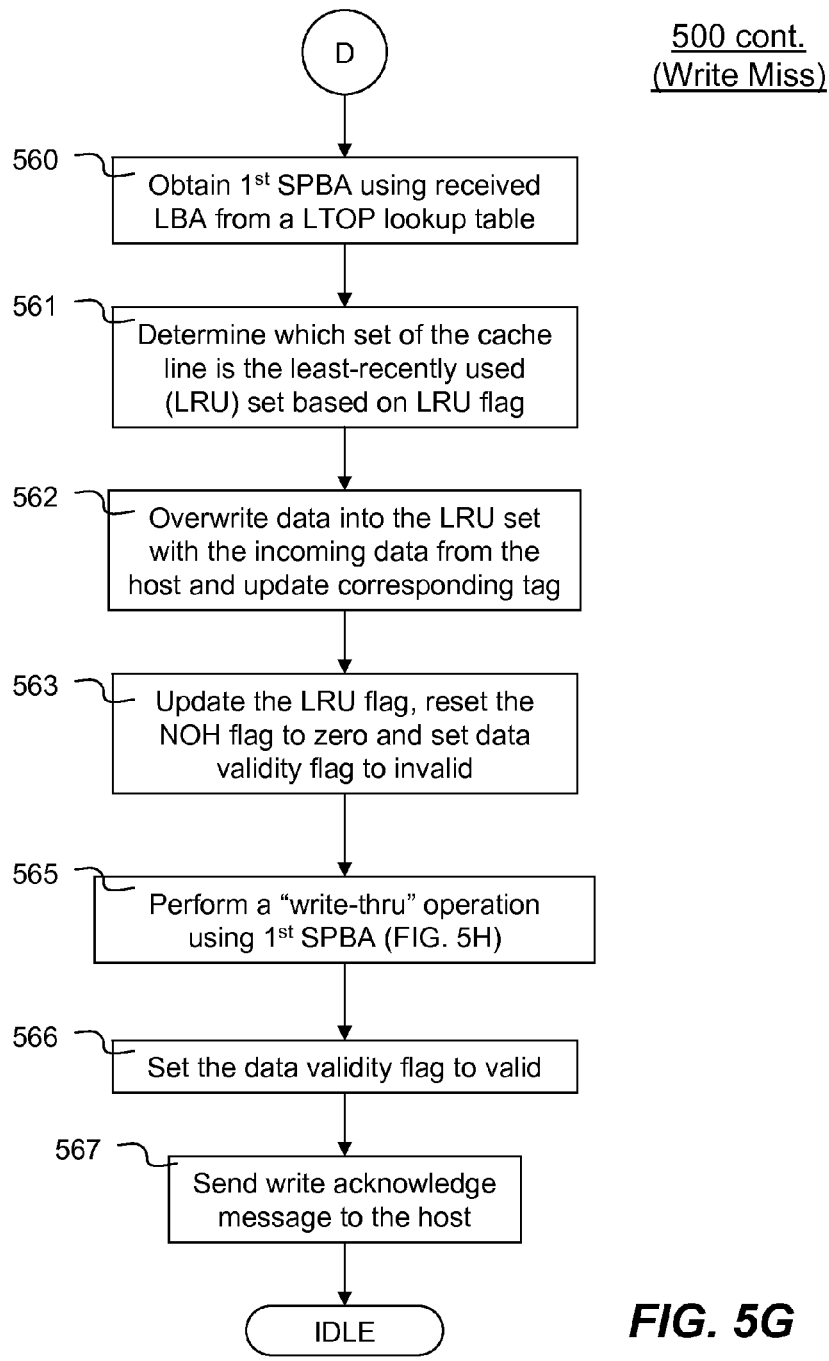
Figure 5H:
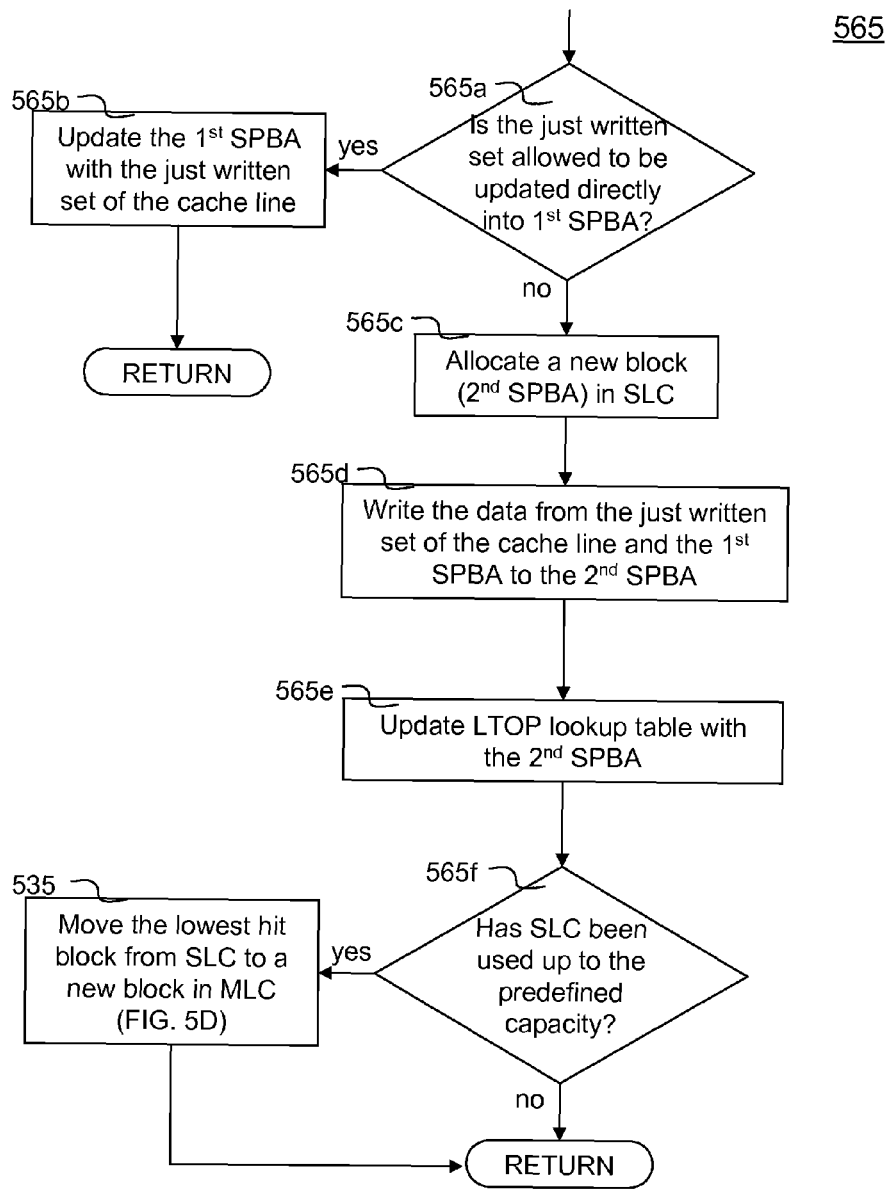

FIG. 5G shows the detailed process for the condition of 'cache-miss' and 'data write'. First at 560, the process 500 obtains a $1^{st}$ SPBA based on the received LSA through the LTOP lookup table. Then, at 561, the process 500 finds the least-recently used set of the cache line according to the LRU flag. Next, the process 500 overwrites the least-recently used set of the cache line with the incoming data and updates the respective tag at 562. At 563, the process 500 updates the LRU flag, resets the NOH flag to zero and sets the data validity flag to invalid. Then at 565, the process 500 performs a 'write-thru' operation to the SLC at the $1^{st}$ SPBA. The details of step 565 are shown in FIG. 5H. After the 'write-thru' operation is completed, the data validity flag is set back to valid at 566. Finally, the process 500 sends a data written acknowledgement message or signal back to the host 100 at 567 before going back to the 'IDLE' state.

Shown in FIG. 5H, the detailed process of step 565 starts at decision 565a. It is determined whether the just written set of the cache line is allowed to be directly written to the physical block of the SLC at the $1^{st}$ SPBA. If 'yes', the incoming data in the just written set of the cache line is written directly into the respective location (i.e., sector) of the physical block in the SLC at the $1^{st}$ SPBA at 565b before the process 500 returns.

If 'no', the process 500 allocates a new block ($2^{nd}$ SPBA) in the SLC at 565c. Next, the process 500 copies the data from the $1^{st}$ SPBA to the $2^{nd}$ SPBA with the update from the just written set of the cache line at 565d. Then, at 565e, the LTOP lookup table is updated with the 2^nd SPBA. Next at decision 565f, it is determined whether the SLC has been used up to a predefined capacity (e.g., a fixed percentage to ensure at least one available data block for data programming operation). If 'no', the process 500 returns. Otherwise at 535, the process 500 moves the lowest hit block from the SLC to a new block in the MLC. The details of step 535 are shown and described in FIG. 5D. The process 500 returns after the lowest hit block in the SLC has been erased for reuse.

According to one embodiment of the present invention, the SLC and the MLC are configured with same size data page such that the data movement between the SLC and MLC can be conducted seamlessly in the exemplary process 500.

FIGS. 6A-6H shows a sequence of data transfer operations based on the exemplary process 500 in the NVMD 170 of FIG. 1B, according to an embodiment of the present invention. In order to simplify the illustration, the NVMD comprises a 2-set associative cache subsystem with non-volatile memory modules including a SLC and a MLC flash memory module.

Figure 6A:
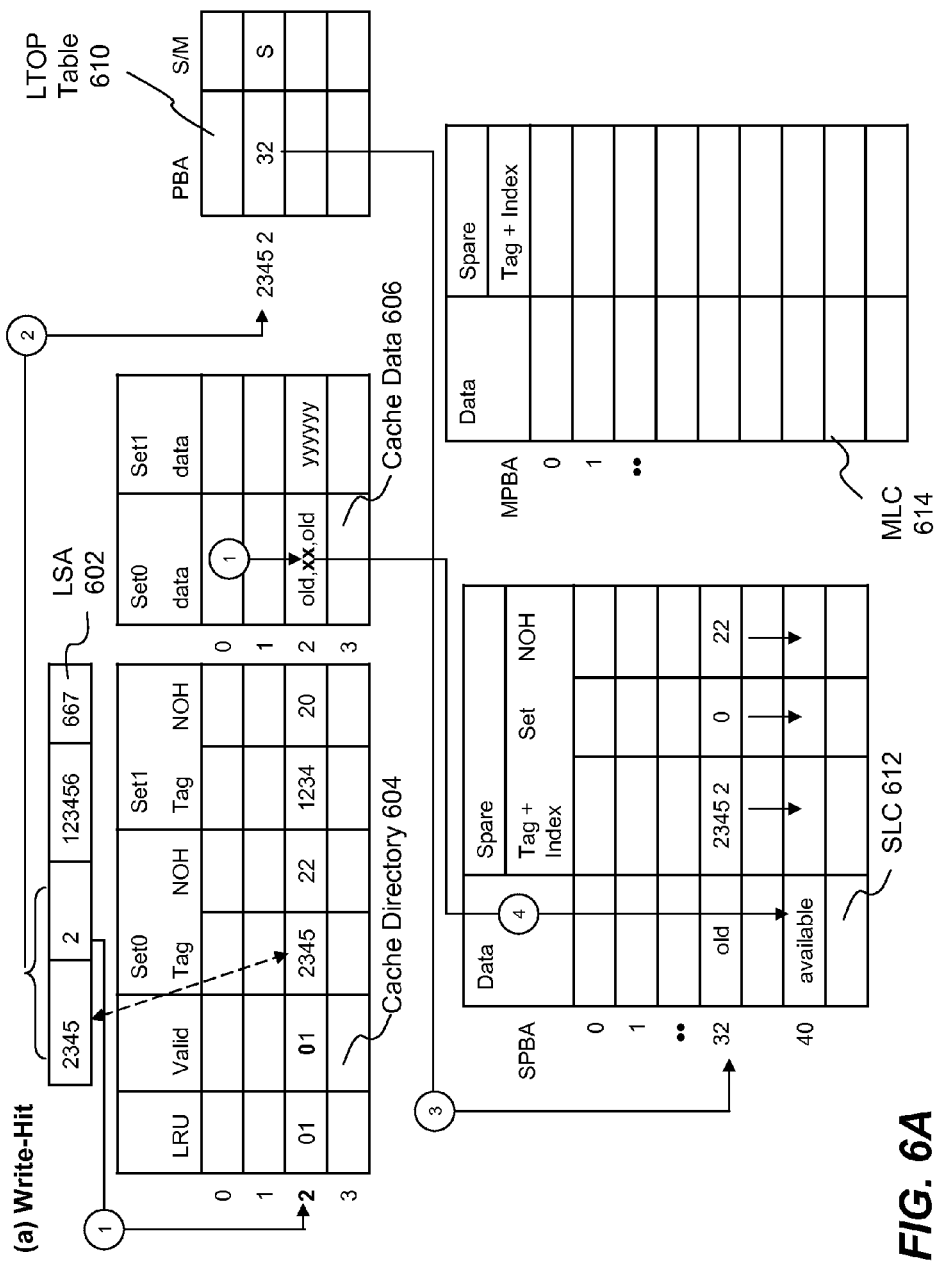
FIGS. 6A-6H shows a sequence of data transfer operations based on the exemplary process 500 in the exemplar NVMD of FIG. 1B, according to an embodiment of the present invention.
Figure 6B:
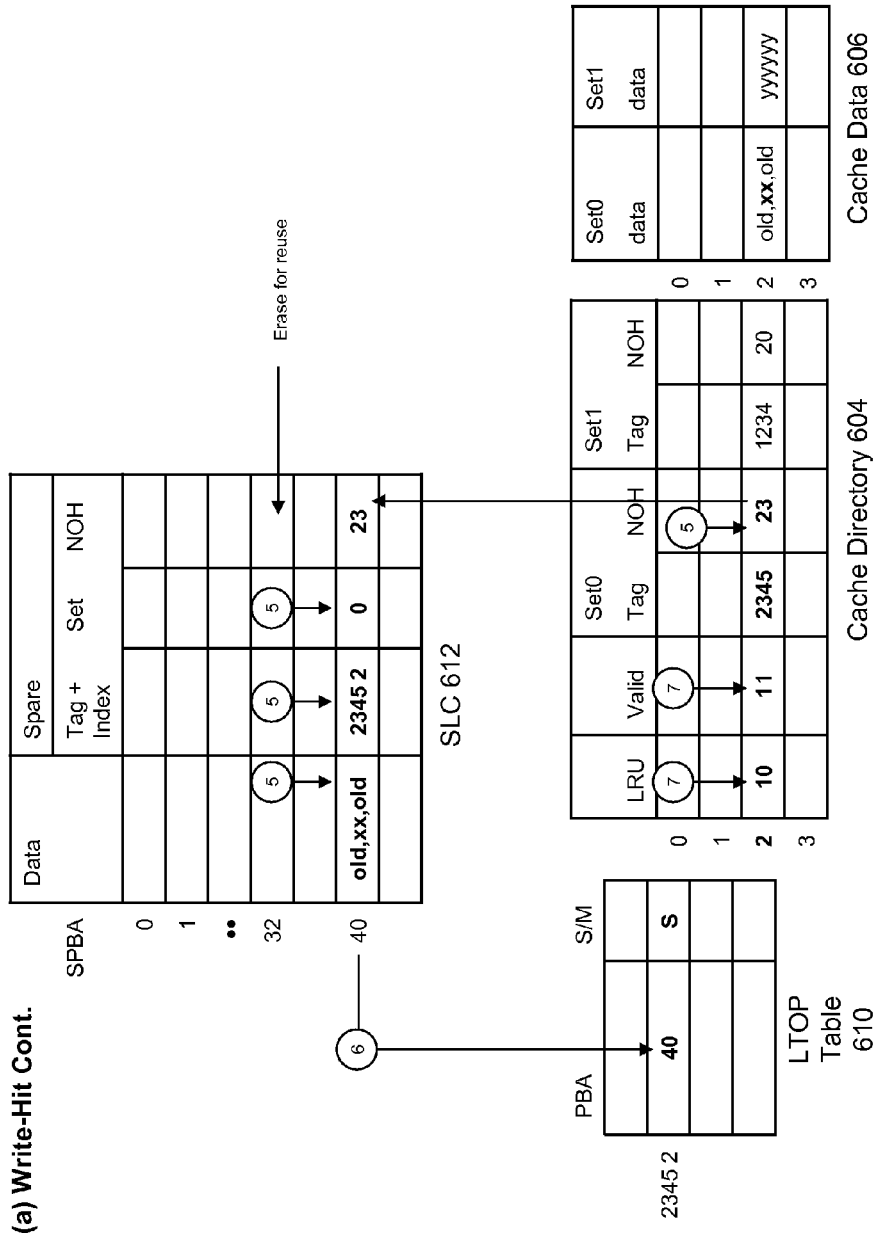

The first data transfer operation is a 'data write' with a 'cache-hit' condition shown as example (a) in FIG. 6A and FIG. 6B. The data transfer operation is summarized as follows:

1) A logical sector address (LSA) 602 is received from a host (e.g., the host computer system 100 of FIG. 1B) with incoming data 'xx', which may be a data sector. Tag and index are extracted from the received LSA 602. The index is '2' which means entry '2' of the cache directory 604. It is used for determining whether there is 'cache-hit'. The tag is '2345', which matches the stored tag in 'Set0'. The incoming data sector 'xx' is then written to 'Set0' of the cache line in cache data 606.
2) A corresponding physical block address (SPBA '32') is obtained through the LTOP lookup table 610 at the received logical block address, which is formed by combining the tag and the index extracted from the received LSA. Since the 'cache-hit' condition is determined, the SPBA '32' is in the SLC 612 as indicated by an 'S' in the LTOP table 610.
3) SPBA '32' is then checked if the incoming data 'xx' is allowed to be written directly into. In this example (a), the answer is no.
4) Accordingly, a new block (SPBA '40') in the SLC 612 is allocated.
5) Data in the old block (i.e., SPBA '32') is copied to the new block (SPBA '40') with the update (i.e., 'xx') from the 'Set0' of the cache line. Additionally, tag, index and set number stored in the spare area of the first page of SPBA '32' is copied to the corresponding spare area of the first data page of SPBA '40'. The NOH flag is incremented in the cache directory 604 and then written into the spare area of the first page of SPBA '40'.
6) The LTOP lookup table 610 is updated with the new block number SPBA '40' to replace the old block number SPBA '32'. The old block at SPBA '32' in the SLC 612 is erased for reuse.
7) Finally, the least-recently used (LRU) flag and the data validity flag are updated accordingly in the cache directory 604.

It is noted that MLC 614 is not programmed at all in this example (a), thereby, prolonging the MLC endurance.

Figure 6C:
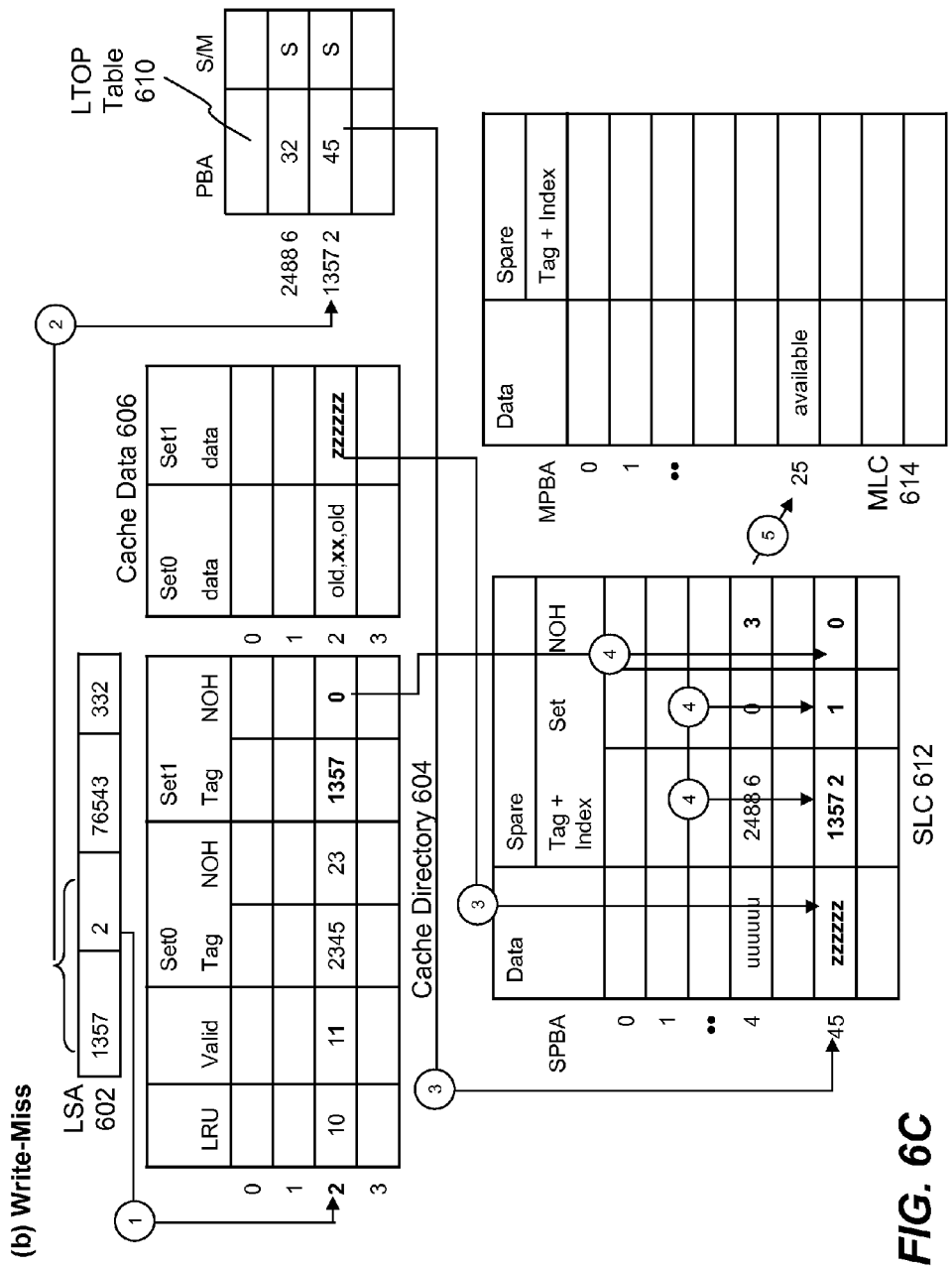
Figure 6D:
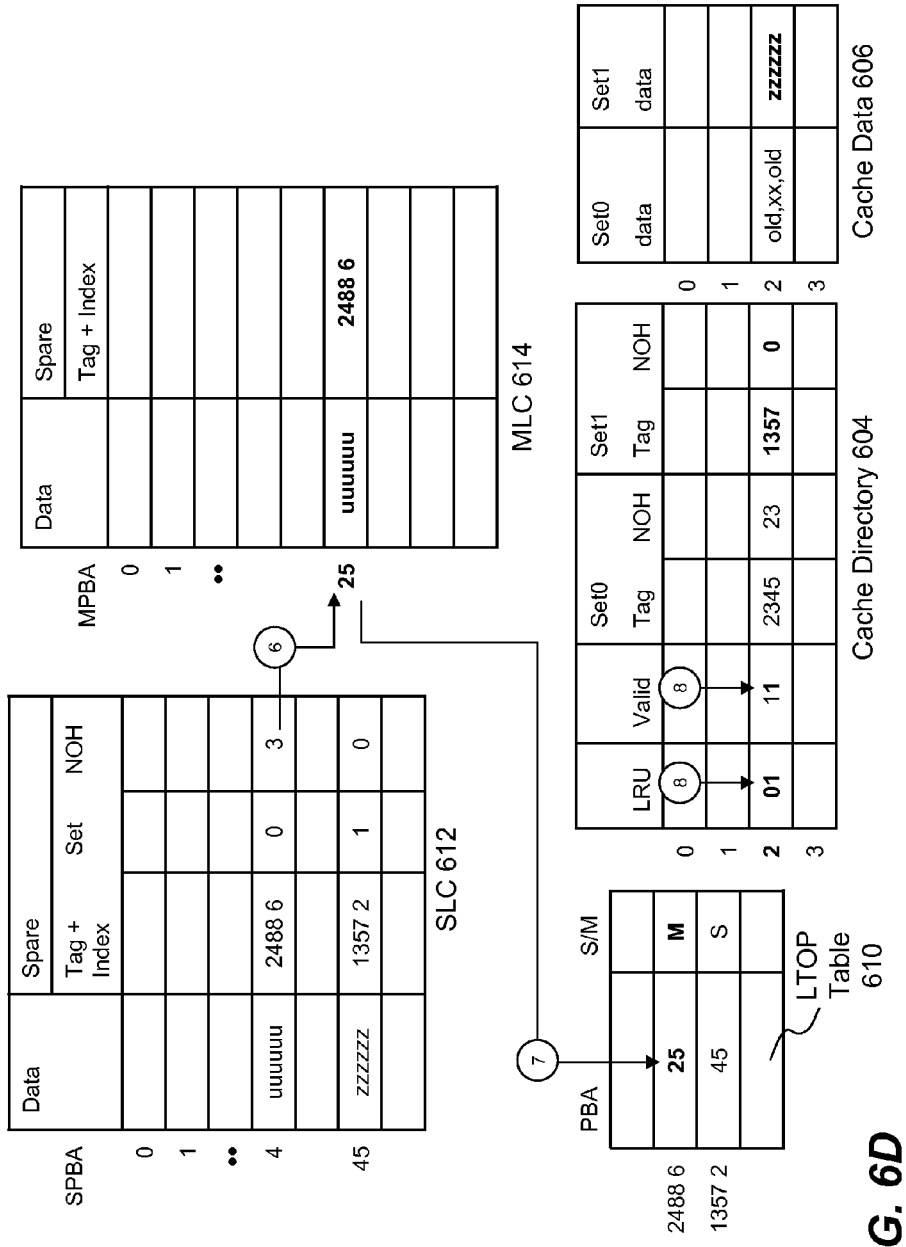

The second data transfer operation is a 'data write' with a 'cache-miss' condition shown as example (b) in FIG. 6C and FIG. 6D. The data transfer operation is summarized as follows:

1) A logical sector address (LSA) 602 is received from a host with incoming data 'zzzzzz', which may be a data block. Tag and index are extracted from the received LSA 602. Again, the index is '2' which means entry '2' of the cache directory 604. The tag is '1357', which does not match any of the stored tags in cache entry '2'. Therefore, this is a condition of 'cache-miss'. A least-recently used set is then determined according to the LRU flag in the cache directory 604. In this example (b), 'Set1' is determined to be the least-recently used. The incoming data 'zzzzzz' is then written into 'Set1' of the cache line in entry '2'. The NOH flag is reset to zero accordingly.
2) A corresponding physical block address (SPBA '45') is obtained through the LTOP lookup table 610 at the received logical block address (LBA), which is formed by combining the tag and the index.
3) The just written data 'zzzzzz' in the 'Set1' of the cache line is then written into SPBA '45' in the SLC 612.
4) The tag and the index, the set number (i.e., 'Set1') and the NOH flag are also written to the spare area of the first page of the physical block SPBA '45'.
5) Next, if the SLC 612 has been used up to its predefined capacity, which is the case in the example (b), the lowest hit block (SPBA '4') is identified in the SLC 612 according to the NOH flag. A new available block (MPBA '25') in the MLC is allocated.
6) The data from the SPBA '4' is copied to MPBA '25' including tag and index in the first page.
7) The corresponding entry in the LTOP lookup table 610 is updated from SPBA '4' to MPBA '25'. The lowest hit block in the SLC at SPBA '4' is erased for reuse.
8) Finally, the LRU flag and the data validity flag are updated accordingly.

It is noted that the MLC 614 is written or programmed only when the predefined capacity of the SLC 612 has been used up.

Figure 6E:
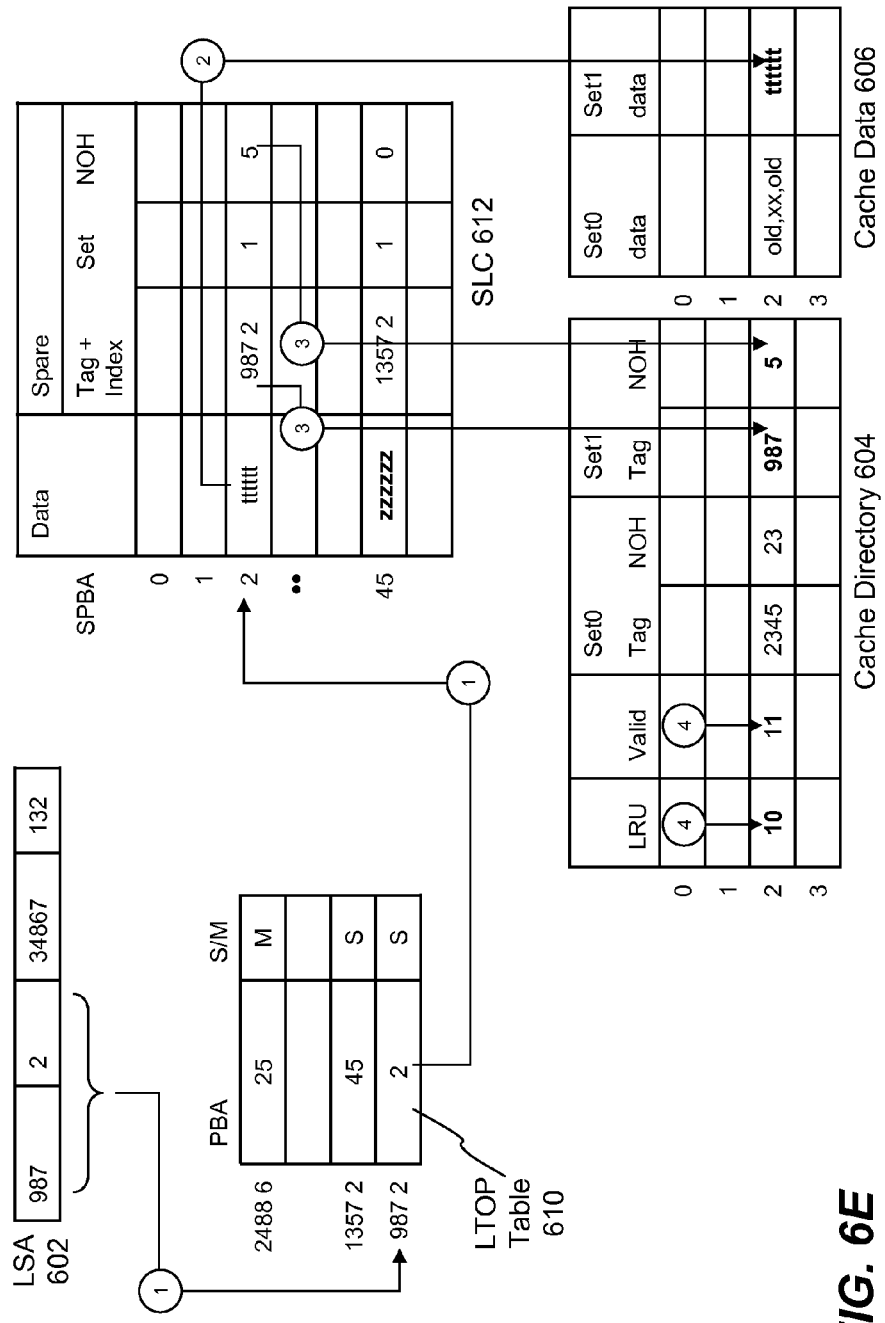

The third data transfer operation is a 'data read' with a 'cache-miss' in the SLC shown as example (c1) in FIG. 6E. The data transfer operation is summarized as follows:

1) A logical sector address (LSA) 602 is received from a host. Tag and index are extracted from the received LSA 602. The tag and index is '987 2' which represents the logical block address (LBA). A physical block address is obtained through the LTOP lookup table 610. In the example (c1), the SPBA '2' in the SLC 612 is determined.
2) The data 'ttttt' stored at SPBA '2' is copied to the least-recently used set of the cache line, which 'Set1' in the example (c1).
3) Corresponding tag and the NOH flag are copied from the spare area of the first page of the SPBA '2' to the cache directory.
4) The LRU and data validity flags are also updated accordingly.

Again, it is noted that the MLC is not programmed or written at all in the example (c1).

Figure 6F:
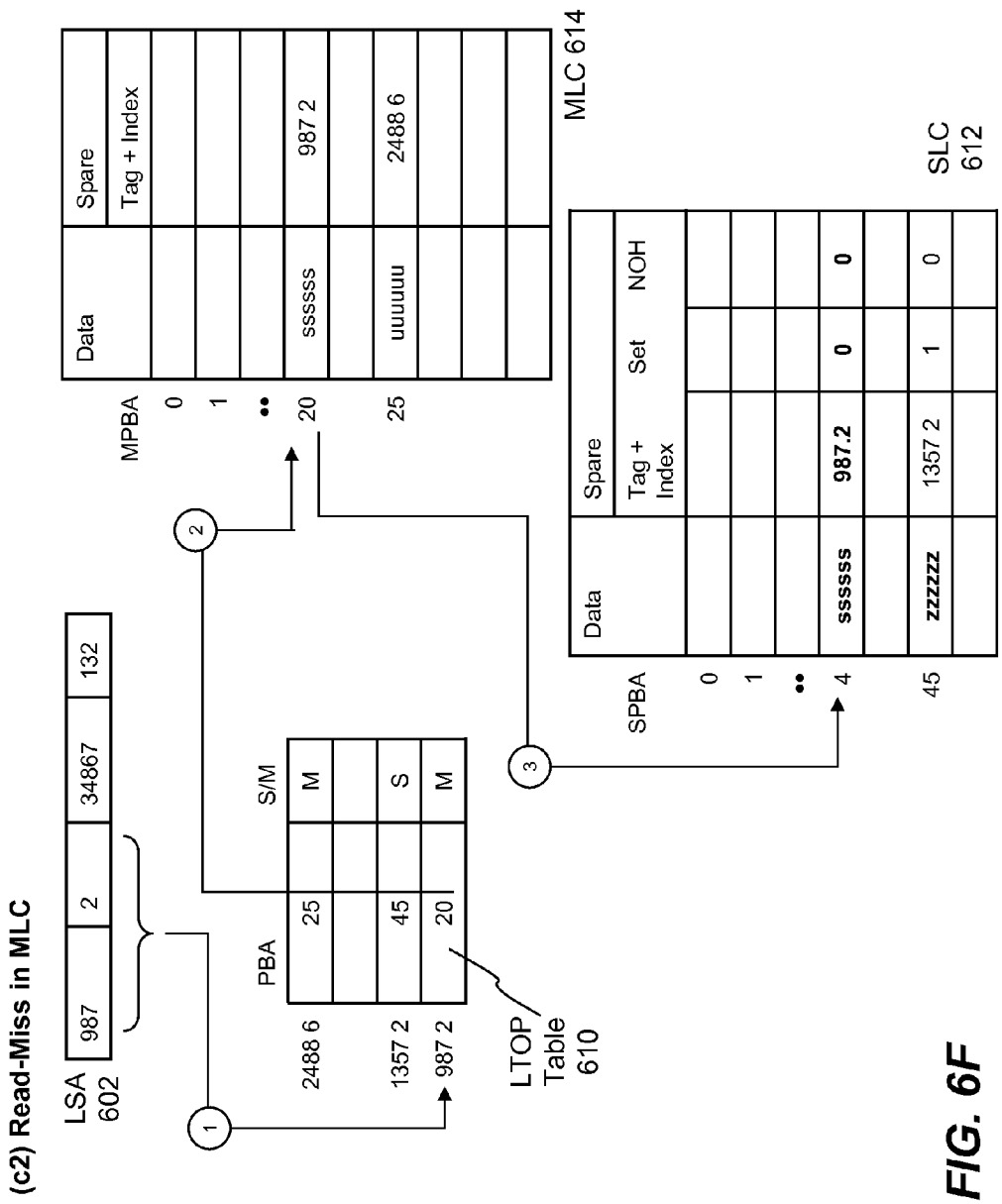
Figure 6G:
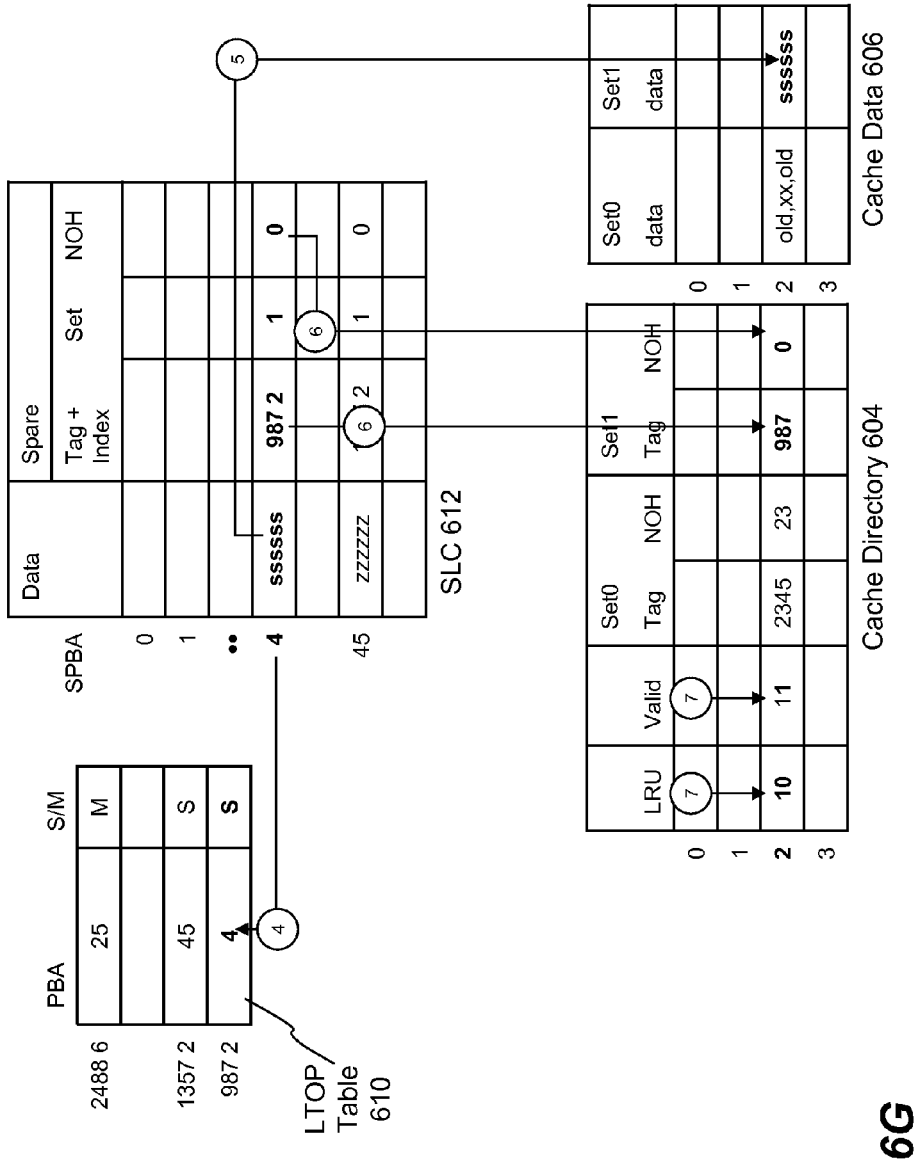
Figure 6H:
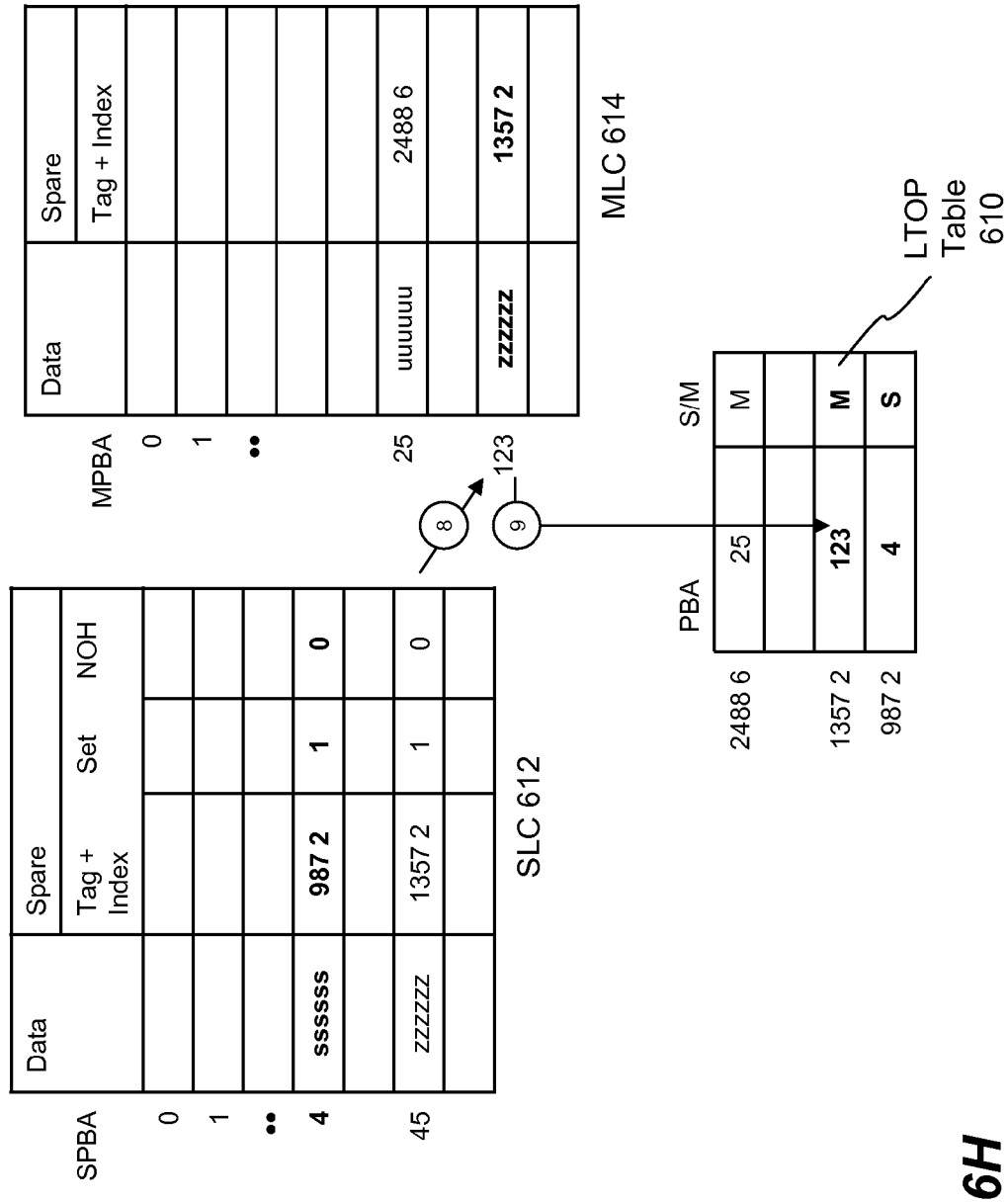

The fourth data transfer operation is a 'data read' with a 'cache-miss' in the MLC shown as example (c2) in FIGS. 6F-6H. The data transfer operation is summarized as follows:

1) A logical sector address (LSA) 602 is received from a host. Tag and index are extracted from the received LSA 602. The tag and the index is '987 2' which represents the logical block address (LBA). A physical block address is obtained through the LTOP lookup table 610.
2) In this example (c2), the MPBA '20' in the MLC 614 is determined.

3) A new block SPBA '4' is allocated in the SLC 612, and the data 'ssssss' stored at MPBA '20' is copied into the SLC at SPBA '4' and the tag and index '987 2' in the first page is copied also.
4) The LTOP lookup table 610 is updated with SPBA '4' replacing MPBA '20' in the corresponding entry.
5) The data 'ssssss' stored at SPBA '4' is then copied to the least-recently used set of the cache line, which is 'Set1' in the example (c2).
6) Corresponding tag and the NOH flag are copied from the spare area of the first page of the SPBA '4' to the respective locations in the cache directory.
7) The LRU and data validity flags are also updated accordingly.
8) Finally, if the SLC has reached the predefined capacity, a new block MPBA '123' in the MLC 614 is allocated. The data stored in the lowest hit block SPBA '45' in the SLC 612 is copied to the MPBA '123' including tag and index in the first page.
9) Finally, the LTOP lookup table 610 is updated with MPBA '123' replacing SPBA '45'.

It is noted that the MLC is not programmed or written unless the SLC has reached its predefined capacity.

FIG. 7 is a flowchart showing an exemplary process 700 of initialization the data cache subsystem 176 during a power up or reset of the NVMD 170 of FIG. 1B in accordance with one embodiment of the present invention. The process 700 starts when the NVMD 170 receives a power on or reset signal at 702. Next, at 704, the process 500 reads the tag, the index, the set number and the NOH flag from spare area of the first data page of a block of the SLC in a sequential order. At decision 706, it is determined whether the particular set according to the just read set number has been filled. If 'no' the process 700 loads the stored data from the SLC to the set of the cache line and then fills in the corresponding tag and the NOH flag at 707. Next the process 700 moves to decision 712. It is determined whether there are any more blocks in SLC to be processed. If 'no' the initialization process 700 ends, otherwise the process 700 goes back to 704 for processing another block in the SLC.

If 'yes' at decision 706, the process 700 moves to another decision 708, it is determined whether the just read NOH flag contains a higher number than the number of write hits stored in the currently filled set of the cache line. If 'no', the process moves to decision 712 similar to the previous test. If 'yes', the process 700 loads the data from the SLC to overwrite the data in that set of the cache line and then fills in the corresponding tag and the NOH flag at 710 before moving to decision 712.

Figure 8A:
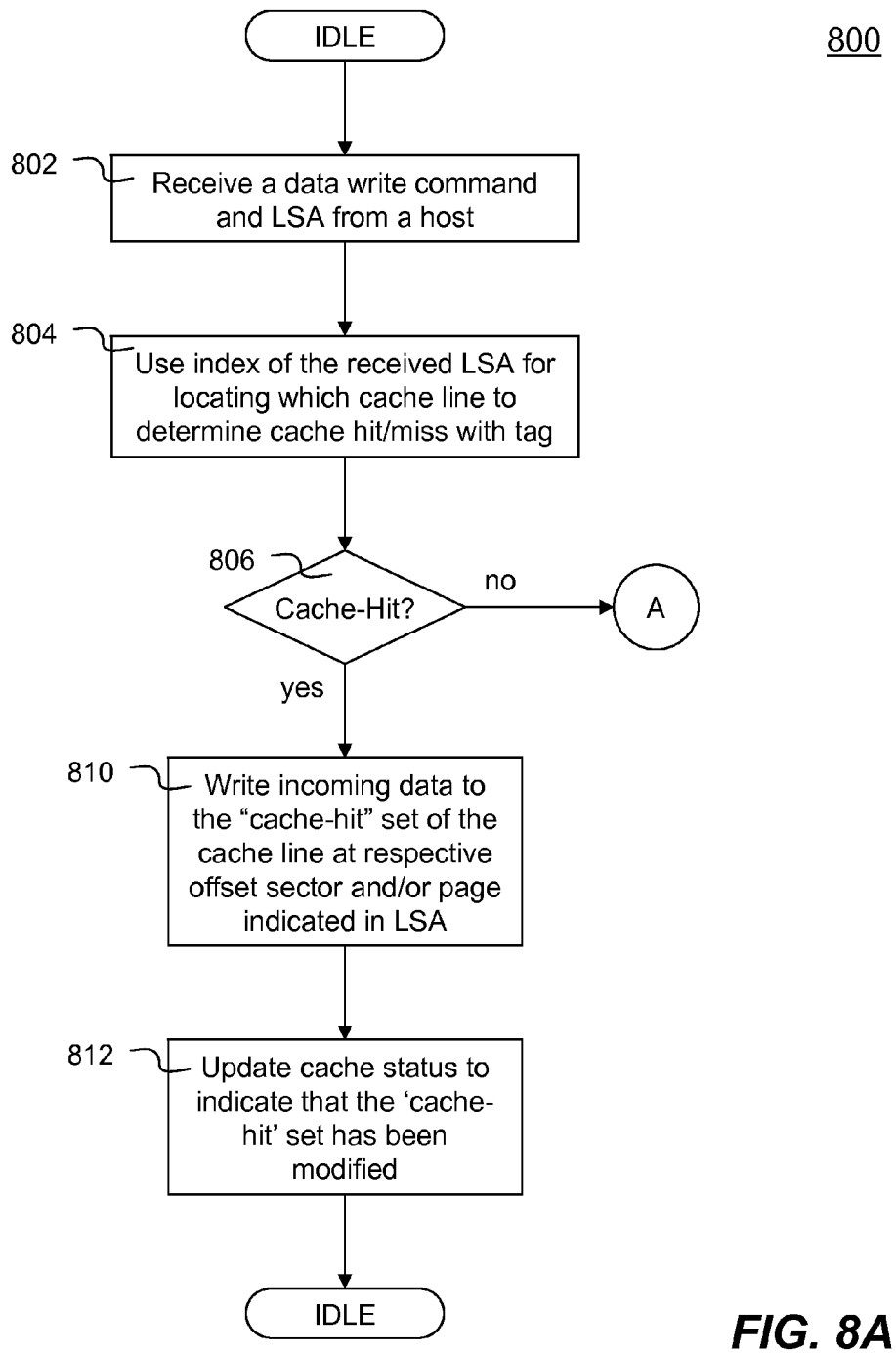
FIGS. 8A-8B collective show a flowchart of an exemplary process 800 of a data programming operation in the NVMD of FIG. 1A, according an embodiment of the present invention.
Figure 8B:
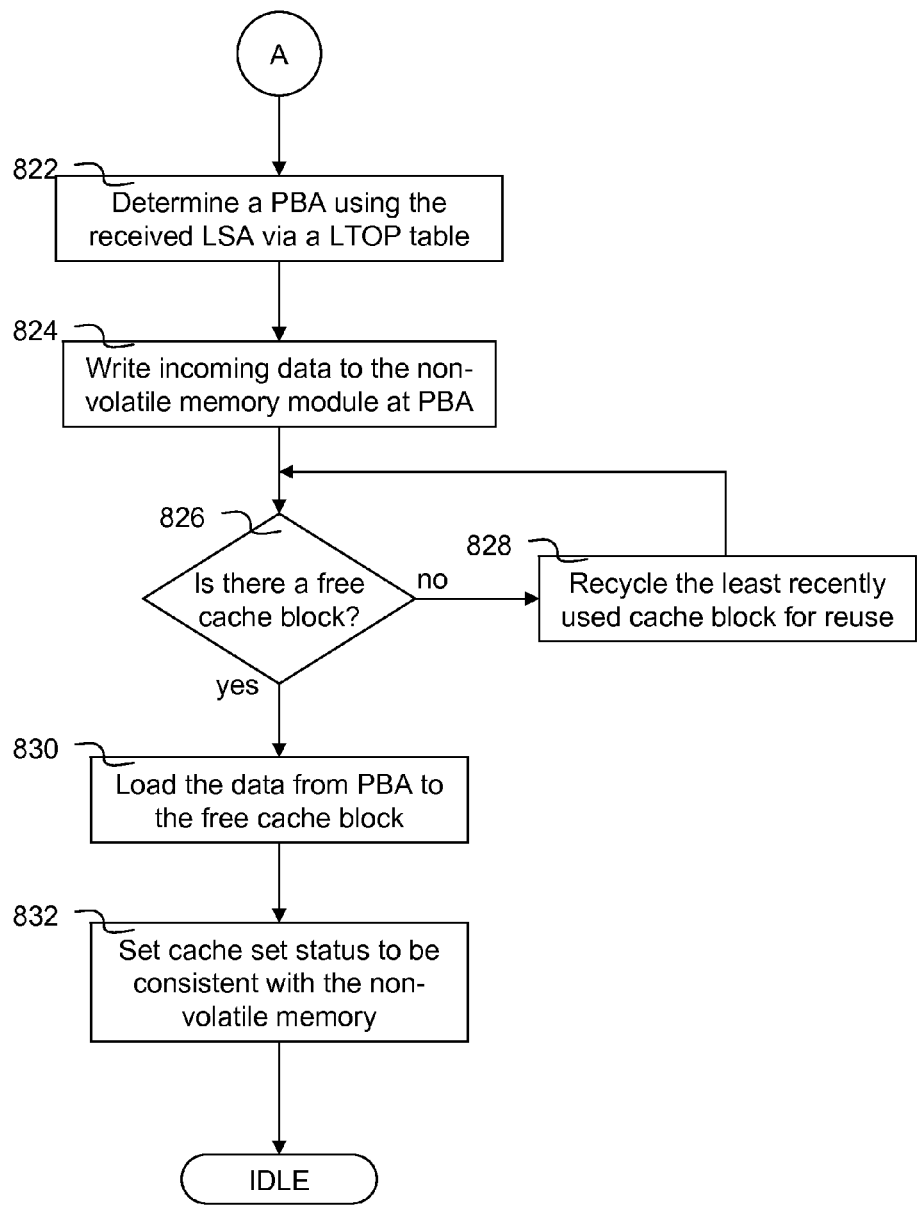

Referring to FIGS. 8A-8B, a flowchart showing an exemplary process 800 of a data programming operation in the NVMD 130 of FIG. 1A, according an embodiment of the present invention. The process 800 starts in an 'IDLE' state until a data programming or writing command has been received at 802. A logical sector address (LSA) is also received from the host 100. Next, at 804, the received index and tag are extracted from the LSA. Then, a 'cache-hit' or 'cache-miss' is determined at decision 806. If the 'cache-hit' condition is determined, the process 800 writes the incoming data into the 'cache-hit' set of the cache line at 810. Finally, at 812, the process 800 updates the cache status (e.g., dirty bit, pointer, tag, etc.) before going back to the 'IDLE' state.

If the 'cache-miss' condition is determined at decision 806, the process 800 determines a physical address (PBA) corresponding to the received LSA through the LTOP lookup table at 822. Next, at 824, process 800 writes the incoming data into the non-volatile memory module at the PBA. Then at decision 826, it is determined whether there is any free or available cache set, if 'no', the least-recently used cache set is recycled for reuse at 828. Otherwise, the process 800 loads the data from PBA to a free cache set at 830. Finally, at 832, the process 800 sets cache set status to be consistent with the state in the non-volatile memory before going back to the 'IDLE' state waiting for another data transfer request. The process 800 uses a 'write-back' policy for managing the cache subsystem, which is an alternative to the 'write-thru' policy employed in the exemplary process 500.

Figure 9A:
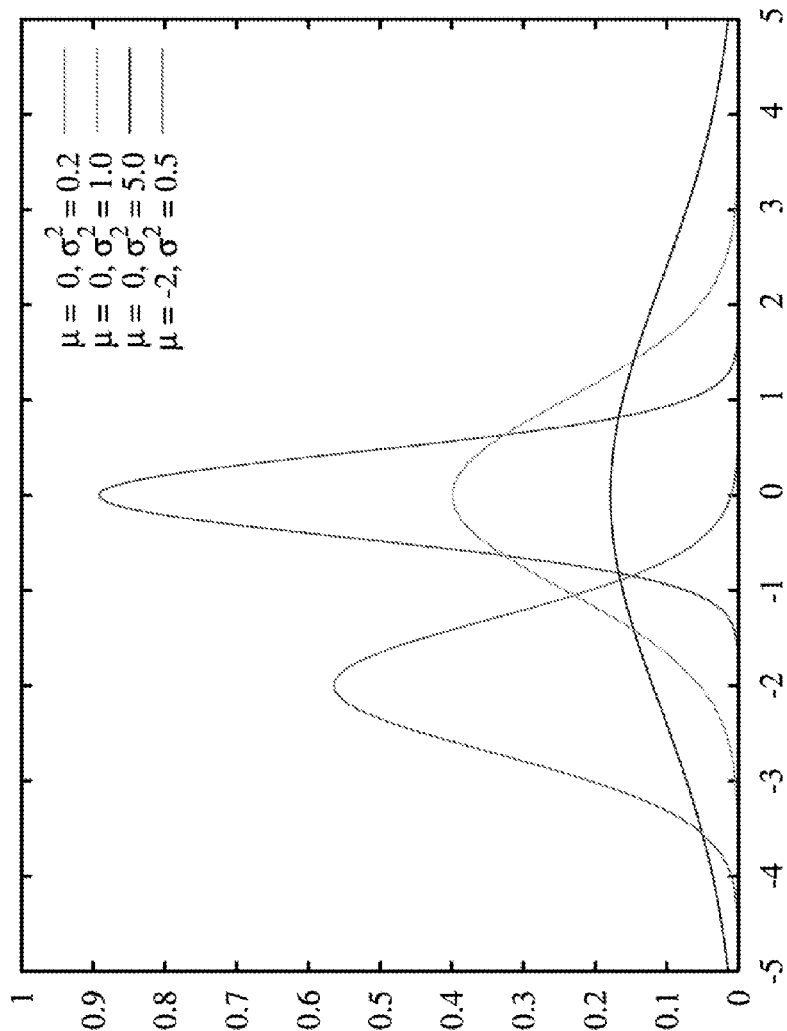
FIG. 9A is a diagram showing an exemplary probability density function may be used in allocating new block in accordance with one embodiment of the present invention.
Figure 9B:
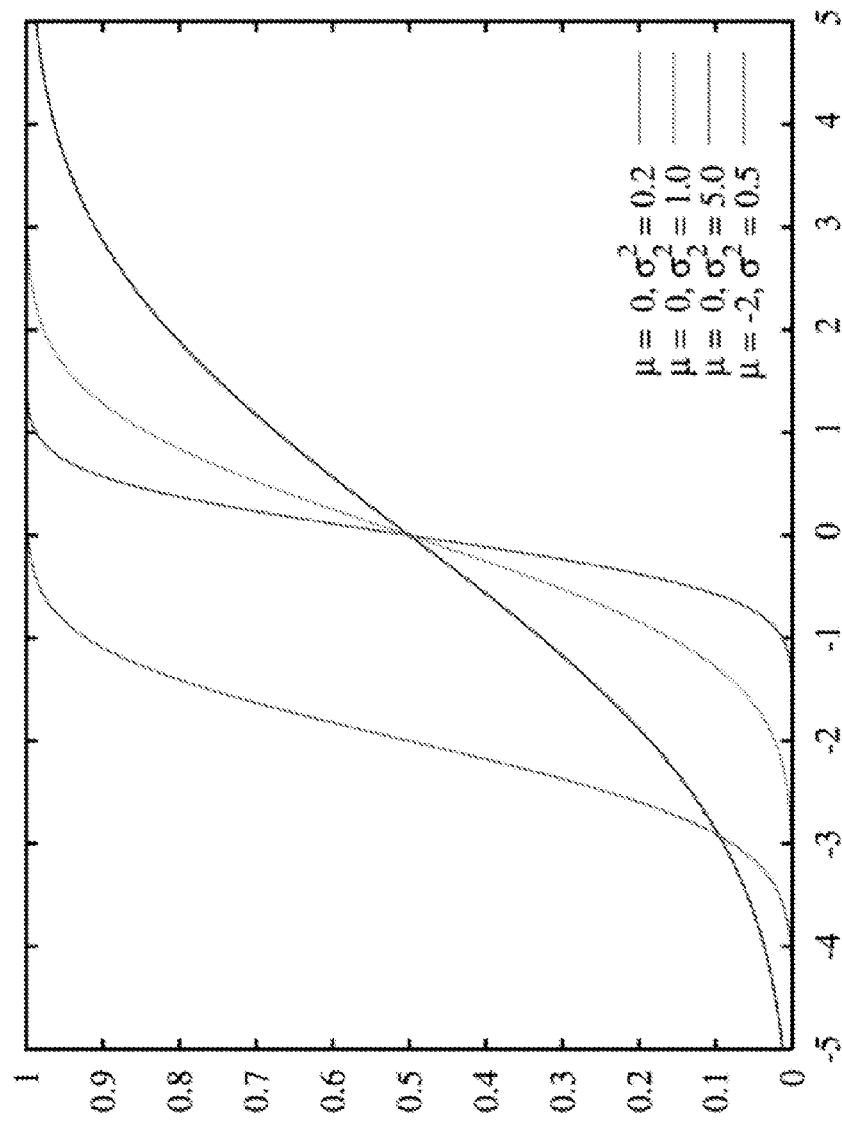
FIG. 9B is a diagram showing an exemplary cumulative distribution density function may be used in allocating new block in accordance with one embodiment of the present invention.

An exemplary probability density function 902 and an exemplary cumulative distribution density function 904 are shown in FIG. 9A and FIG. 9B, respectively. The probability density function and the cumulative distribution function may be used in allocating new block in accordance with one embodiment of the present invention. In allocation of a new block in the MLC, a random selection scheme may be used for assuring the statistically even distribution to achieve wear leveling thus providing a better endurance of the MLC flash memory.

In one embodiment, the random selection scheme uses a random number generator or pseudo random number generator to select a number between 1 and a maximum. The maximum may be defined by physical characteristics of the MLC flash memory in a NVMD. For example, a NVMD includes 8 parallel channels (i.e., page buffers), 4 MLC flash memory chips per channel, two dies per chip, two planes per die, 4096 blocks per plane and 8 pages per block, the maximum is 4194304, which is the products of all of the above. If the pseudo random number generator comes out with a number of 3044967 and the probability density function or cumulative distribution function yields a factor of 0.91572386, the actual new physical block number is 2788348=3044967× 0.91572386. With a random selection based on such process, the wear leveling should be showing a normal distribution.

Figure 10A:
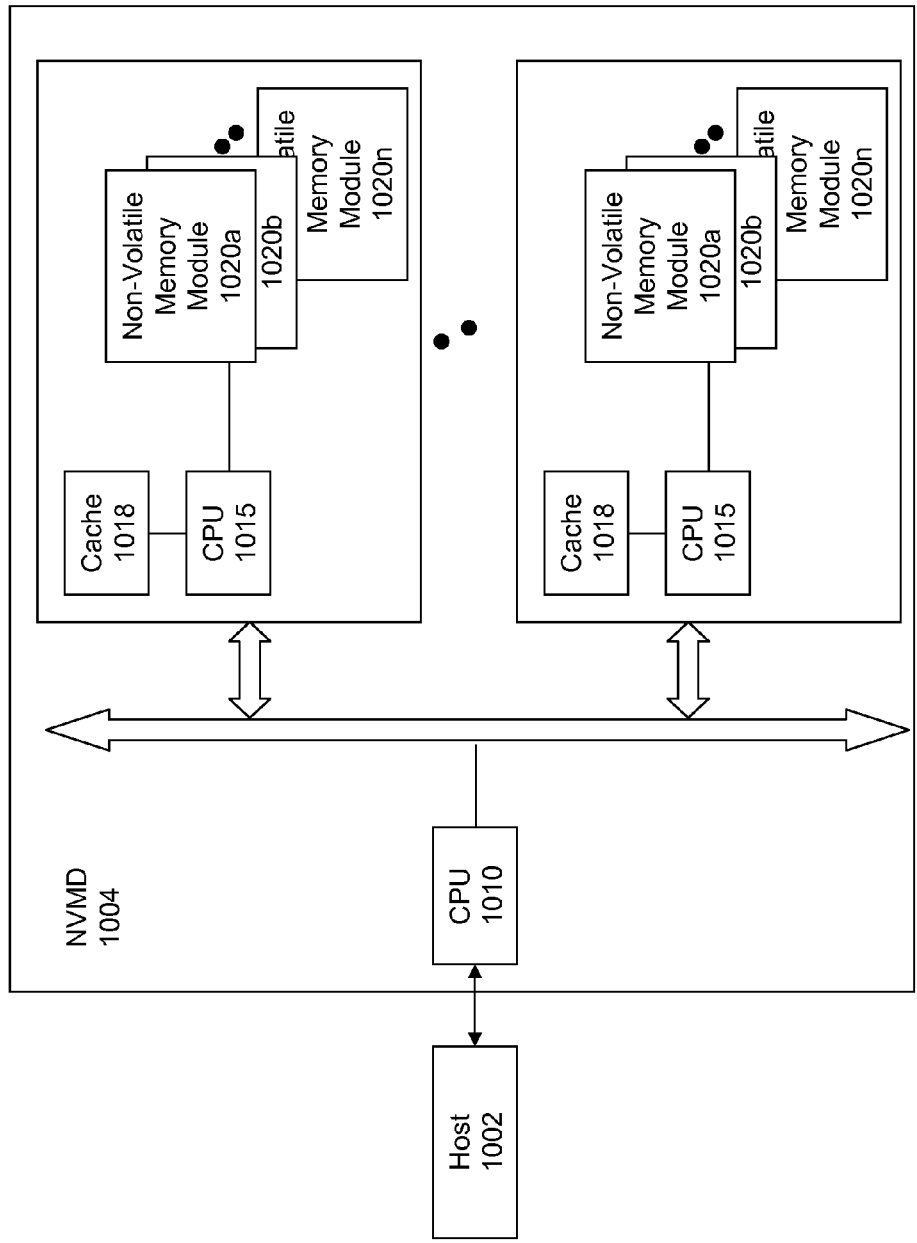
FIG. 10A is a block diagram showing a first alternative NVMD including multiple central processing units (CPUs)

FIG. 10A is a block diagram showing a first alternative NVMD 1004 including multiple central processing units (CPUs). The inventors have considered other possibilities of prolonging the endurance of the NVMD 1004. One of the extensions from the embodiments disclosed herein is to implement multiple CPUs in the NVMD 1004. A first CPU 1010 is configured to transfer the data between a host 1002 and the NVMD 1004, and to distribute the data within internal groups of NVMs such as data and command flows. For example, the first CPU 1010 may separate odd and even address data, each to be distributed to one of the sub-branches or internal NVMs. Each of the internal NVM includes a CPU 1015, a cache subsystem 1018 and at least one non-volatile memory module 1020*a-n*. The cache subsystem 1018 is substantially similar to the cache subsystems described herein. The main objective of the cache subsystem is to reduce direct programming to the NVM hence improving the endurance of the NVM.

The first CPU 1010 is further configured to provide load balance to each of the internal NVMs by evenly distribute the data transfer traffic. Since each of the internal NVMs includes a cache subsystem 1018 and a CPU 1015, a higher data hit rate may be achieved due to only limited amount of data have been requested and accessed.

Figure 10B:
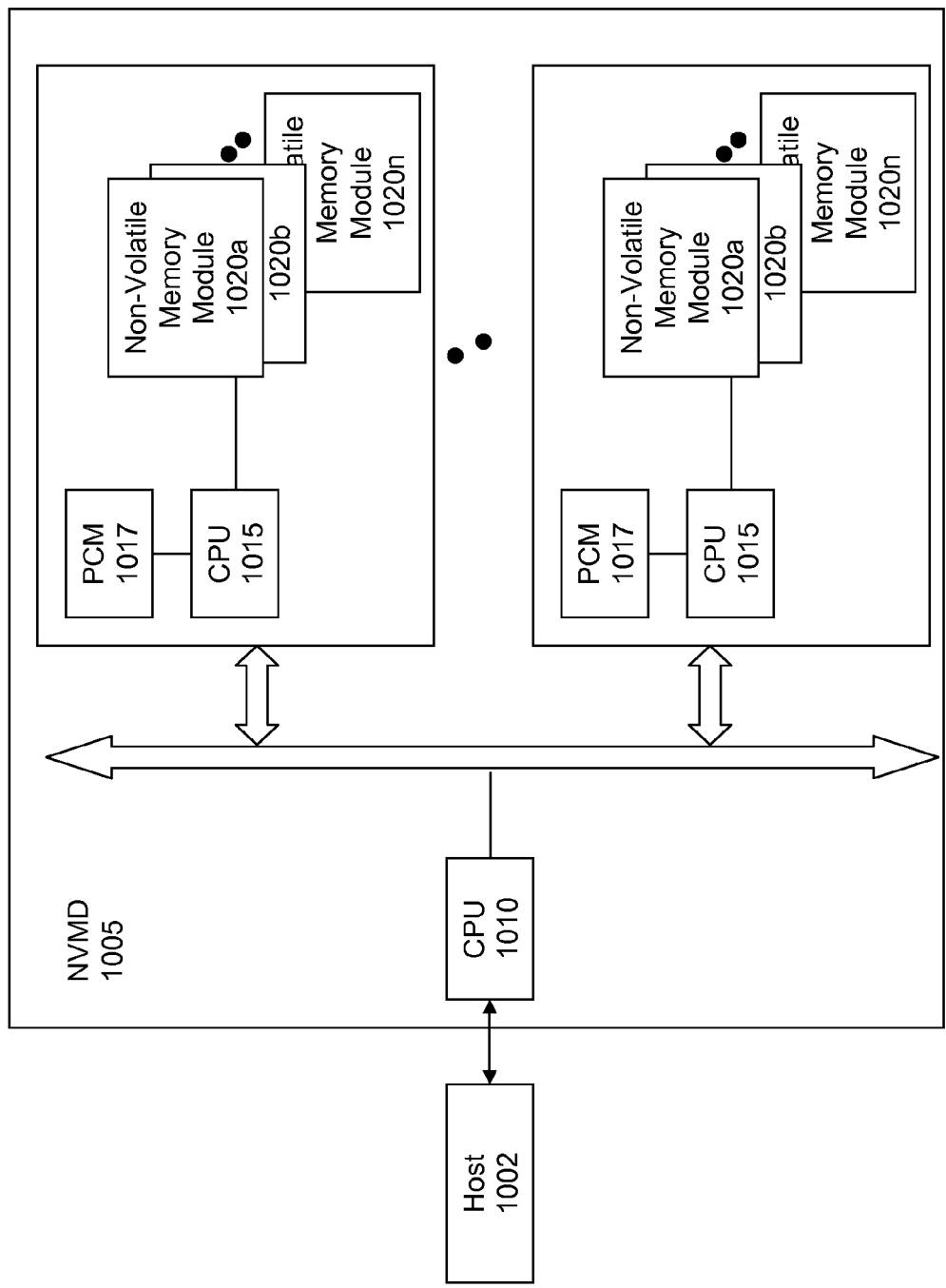
FIG. 10B is a block diagram showing a second alternative NVMD including multiple CPUs.

A second alternative multi-CPU NVMD 1005 is shown in FIG. 10B, according to one embodiment of the present invention. The second alternative NVMD 1005 is substantially similar to the first NVMD 1004. The major difference is that each of the internal NVMD is one of the sixth exemplary NVMD 195 of FIG. 1E. Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas the MLC flash memory has been described and shown using a 128-page block, other numbers of pages per block may also be used. For example, a smaller number such as 32 pages per block may be preferred to reduce the frequencies of writing or programming to a new block. That is because a smaller number of pages would result into less chance to reprogram comparing to larger number of pages. Additionally, whereas SLC and MLC have been shown and described as two types of non-volatile memory with a volatile memory (DRAM) based cache subsystem, other combinations may accomplish the same, for example, phase-change memory may be used to substitute either SLC, MLC or DRAM. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A non-volatile memory device (NVMD) comprising:
   a central processing unit (CPU);
   a data cache subsystem coupled to the CPU, said data cache subsystem being initialized by a method comprises:
   (a) receiving a power on or reset signal in the NVMD;
   (b) retrieving a tag, an index, a set number and a number-of-hits flag from a spare area of a first page of a block in the first type of NVM;
   (c) loading stored data from data area of all of the pages of the block of the first type of NVM into a particular cache line in the data cache subsystem when the particular cache line is empty, wherein the particular cache line is determined by the retrieved index and the retrieved set number;
   (d) otherwise loading the stored data from data area of all of the pages of the block of the first type of NVM into the particular cache line only if the retrieved number-of-hits flag shows a number greater than number-of-hits already stored in the cache line; and
   repeating (a)-(d) for another block of the first type of NVM until there is no more blocks;
   at least one non-volatile memory (NVM) module configured as a data storage of a host as the NVMD is operatively adapted to the host, said at least one non-volatile memory module having first and second types of NVM arranged in a hierarchical scheme with the first type of NVM configured as a buffer between the data cache subsystem and the second type of NVM;
   a NVM controller, coupling to the CPU, configured for managing said at least one NVM module; and
   an input/output (I/O) interface, coupling to the NVM controller, configured for receiving incoming data from the host to the data cache subsystem and configured for sending outgoing data from the data cache subsystem to the host.

2. The device of claim 1, wherein the first type and the second type are so configured that data programming to the second type is minimized.

3. The device of claim 1, wherein the first type of NVM and the second type of NVM comprises same size of data page.

4. The device of claim 1, wherein capacity of the first type of NVM is smaller than that of the second type of NVM and larger than that of the data cache subsystem.

5. The device of claim 1, wherein the first type of NVM comprises Single-Level Cell flash memory and the second type of NVM comprises Multi-Level Cell flash memory.

6. The device of claim 1, wherein the at least one NVM module comprises one of flash memory, phase-change memory, Magnetoresistive random access memory, Ferroelectric random access memory, and Nano random access memory.

7. The device of claim 1, wherein the data cache subsystem comprises at least one level of data cache.

8. The device of claim 7, wherein the data cache subsystem is one of a multiple-set associative cache system and a direct mapping cache system.

9. The device of claim 1, wherein said I/O interface comprises one of Advanced Technology Attachment (ATA), Serial ATA (SATA), Small Computer System Interface (SCSI), Universal Serial Bus (USB), Peripheral Component Interconnect (PCI) Express, ExpressCard, fiber channel Interface, optical connection interface circuit, and Secure Digital.

10. The device of claim 1, wherein the first type of NVM is single-level cell flash memory while the second type of NVM is multi-level cell flash memory.

11. The device of claim 1, wherein said data cache subsystem comprises phase-change memory and said at least one non-volatile memory comprises single-level cell flash memory.

12. The device of claim 1, wherein said data cache subsystem comprises phase-change memory and wherein said at least one non-volatile memory comprises multi-level cell flash memory.

13. The device of claim 1, wherein said data cache subsystem comprises dynamic random memory and said at least one non-volatile memory comprises single-level cell flash memory.

14. The device of claim 1, wherein said data cache subsystem comprises dynamic random memory and said at least one non-volatile memory comprises multi-level cell flash memory.

15. A multi-processor non-volatile memory device (NVMD) comprising:
   a plurality of internal non-volatile memory devices;
   a first central processing unit (CPU) configured for managing and controlling the plurality of internal non-volatile memory devices coupled therewith, wherein each of the plurality of internal non-volatile memory devices includes:
   a second CPU;
   a data cache subsystem coupled to the second CPU, said data cache subsystem being initialized by a method comprises:
   (a) receiving a power on or reset signal in the NVMD;
   (b) retrieving a tag, an index, a set number and a number-of-hits flag from a spare area of a first page of a block in the first type of NVM;
   (c) loading stored data from data area of all of the pages of the block of the first type of NVM into a particular cache line in the data cache subsystem when the particular cache line is empty, wherein the particular cache line is determined by the retrieved index and the retrieved set number;
   (d) otherwise loading the stored data from data area of all of the pages of the block of the first type of NVM into the particular cache line only if the retrieved number-of-hits flag shows a number greater than number-of-hits already stored in the cache line; and
   repeating (a)-(d) for another block of the first type of NVM until there is no more blocks; and
   at least one non-volatile memory (NVM) module configured as a data storage of a host as the NVMD is operatively adapted to the host, said at least one non-volatile memory module having first and second types of NVM arranged in a hierarchical scheme with the first type of NVM configured as a buffer between the data cache subsystem and the second type of NVM.

16. The device of claim 15, wherein said data cache subsystem comprises dynamic random memory.

17. The device of claim 15, wherein said data cache subsystem comprises phase-change memory.

18. The device of claim 15, wherein the first type of NVM is single-level cell flash memory while the second type of NVM is multi-level cell flash memory.

\* \* \* \* \*